(12) United States Patent
Tour et al.

(10) Patent No.: US 9,845,551 B2
(45) Date of Patent: Dec. 19, 2017

(54) METHODS FOR PRODUCTION OF SINGLE-CRYSTAL GRAPHENES

(71) Applicants: James M. Tour, Bellaire, TX (US); Zheng Yan, Houston, TX (US)

(72) Inventors: James M. Tour, Bellaire, TX (US); Zheng Yan, Houston, TX (US)

(73) Assignee: WILLIAM MARSH RICE UNIVERSITY, Houston, TX (US)

( * ) Notice: Subject to any disclaimer, the term of this patent is extended or adjusted under 35 U.S.C. 154(b) by 1052 days.

(21) Appl. No.: 13/939,086

(22) Filed: Jul. 10, 2013

(65) Prior Publication Data

US 2014/0014030 A1 Jan. 16, 2014

Related U.S. Application Data

(60) Provisional application No. 61/669,882, filed on Jul. 10, 2012.

(51) Int. Cl.
*C30B 25/18* (2006.01)
*C30B 25/02* (2006.01)
(Continued)

(52) U.S. Cl.
CPC ............ *C30B 25/186* (2013.01); *B82Y 30/00* (2013.01); *B82Y 40/00* (2013.01);
(Continued)

(58) Field of Classification Search
CPC ......... C30B 25/00; C30B 25/02; C30B 25/18; C30B 25/186; C30B 29/00; C30B 29/02;
(Continued)

(56) References Cited

U.S. PATENT DOCUMENTS

| 2004/0003873 | A1* | 1/2004 | Chen ................... C22F 1/02 148/518 |
| 2011/0091647 | A1* | 4/2011 | Colombo ............. B82Y 30/00 427/249.1 |
| 2014/0178688 | A1* | 6/2014 | Tour .................. C01B 31/0453 428/408 |

FOREIGN PATENT DOCUMENTS

WO    2012021677 A2    2/2012

OTHER PUBLICATIONS

Luo, et al. publication entitled "Effect of substrate roughness and feedstock concentration on growth of wafer-scale graphene at atmospheric pressure," Chem. Mater., vol. 23, pp. 1441-1447 (2011).*

(Continued)

*Primary Examiner* — Kenneth A Bratland, Jr.
(74) *Attorney, Agent, or Firm* — Winstead PC

(57) ABSTRACT

In some embodiments, the present disclosure pertains to methods of forming single-crystal graphenes by: (1) cleaning a surface of a catalyst; (2) annealing the surface of the catalyst; (3) applying a carbon source to the surface of the catalyst; and (4) growing single-crystal graphene on the surface of the catalyst from the carbon source. Further embodiments of the present disclosure also include a step of separating the formed single-crystal graphene from the surface of the catalyst. In some embodiments, the methods of the present disclosure also include a step of transferring the formed single-crystal graphene to a substrate. Additional embodiments of the present disclosure also include a step of growing stacks of single crystals of graphene.

45 Claims, 32 Drawing Sheets

(51) Int. Cl.
  C30B 29/02 (2006.01)
  C01B 31/04 (2006.01)
  B82Y 30/00 (2011.01)
  B82Y 40/00 (2011.01)
(52) U.S. Cl.
  CPC .......... *C01B 31/0453* (2013.01); *C30B 25/02* (2013.01); *C30B 29/02* (2013.01)
(58) Field of Classification Search
  CPC ......... C30B 29/04; C23C 16/00; C23C 16/02; C23C 16/0209; C23C 16/0218; C23C 16/0227; C23C 16/0236; C23C 16/0245; C23C 16/22; C23C 16/26; C23C 16/27; B82Y 30/00; B82Y 40/00; C01B 31/0453
  USPC .......... 117/84, 87–90, 94, 97, 101, 104–106, 117/902, 913, 922, 928–929
  See application file for complete search history.

(56) References Cited

OTHER PUBLICATIONS

Bae et al. Roll-to-roll production of 30-inch graphene films for transparent electrodes. Nat. Nanotechnol. 5, 574-578 (2010).
K. S. Novoselov et al. Electric field effect in atomically thin carbon films. Science 306, 666 (2004).
R. Ruoff, Graphene: Calling all chemists. Nat. Nanotechnol. 3, 10 (2008).
Y. Hernandez et al. High-yield production of graphene by liquid-phase exfoliation of graphite, Nat. Nanotechnol. 3, 563 (2008).
J. Rohrl et al. Raman spectra of epitaxial graphene on SiC(0001), Appl. Phys. Lett. 92, 201918 (2008).
A. Reina et al. Large area, few-layer graphene films on arbitrary substrates by chemical vapor deposition, Nano Lett. 9, 30 (2009).
X. S. Li et al. Large-area synthesis of high-quality and uniform graphene films on copper foils, Science 324, 1312 (2009).
P.Y. Huang, et al. Grains and grain boundaries in single-layer graphene atomic patchwork quilts, Nature 469, 389 (2011).
Q. K. Yu et al. Control and characterization of individual grains and grain boundaries in graphene grown by chemical vapor deposition, Nat. Mater. 10, 443 (2011).
Sun, Z. et al. Growth of graphene from solid carbon sources. Nature 468, 549-552 (2010).
Kim, K. S. et al. Large-scale pattern growth of graphene film for stretchable transparent electrodes. Nature 457, 706-710 (2009).
Wang, H. et al. Controllable synthesis of submillimeter single-crystal monolayer graphene domains on copper foils by suppressing nucleation. J. Am. Chem. Soc. 134, 3627-3630 (2012).
Li, X. S. et al. Large-area graphene single crystals grown by low-pressure chemical vapor deposition of methane on copper. J. Am. Chem. Soc. 133, 2816-2819 (2011).
Iwasaki, T. et al. Long-range ordered single-crystal graphene on high-quality heteroepitaxial Ni thin films grown on MgO (111). Nano Lett. 11, 79-84 (2011).
Geng, D. et al. Uniform hexagonal graphene flakes and films grown on liquid copper surface. Proc. Natl. Acad. Sci. 109, 7992-7996 (2012).
Zhang, Y. B. et al. Experimental observation of the quantum hall effect and berry's phase in graphene. Nature 438, 201-204 (2005).
Geim, A. K. et al. The rise of graphene. Nat. Mater. 6, 183-191(2007).
Luo, Z. et al. Growth mechanism of hexagonal-shaped graphene flakes with zigzag edges. ACS Nano 23, 9154-9160 (2011).
Vlassiouk, I. et al. Role of hydrogen in chemical vapor deposition growth of karge single-crystal graphene. ACS Nano 5, 6069-6076 (2011).
Kim, H. et al. Activation energy paths for graphene nucleation and growth on Cu. ACS Nano 6, 3614-3623 (2012).
Bhaviripudi, S. et al. Role of Kinetic factors in chemical vapor deposition synthesis of uniform large area graphene using copper catalyst. Nano Lett. 10, 4128-4133 (2010).
Ferrari, A. C. et al. Raman spectrum of graphene and graphene layers. Phys. Rev. Lett. 97, 187401-187404 (2006).
Hwang, E. H. et al. Carrier transport in two dimensional graphene layers. Phys. Rev. Lett. 18, 98 (2007).
Dean, C.R. et al. Boron nitride substrates for high-quality graphene electronics. Nat. Nanotech. 5, 722-726 (2010).
Du, X. et al. Approaching ballistic transport in suspended graphene. Nat. Nanotech. 3, 491-495 (2008).
Bolotin, K. I. et al. Ultrahigh electron mobility in suspended graphene. Solid State Commun.146, 351-355 (2008).
Luo, Z. et al. Effect of substrate roughness and feedstock concentration on growth of wafer-scale graphene at atmospheric pressure. Chem. Mater. 23, 1441-1447 (2011).
Wesep, R. V. et al. Communication: stable carbon nanoarches in the initial stages of epitaxial growth of graphene on Cu (111). J. Chem. Phys. 134, 171105 (2011).
Zhang, W. et al. First-principles thermodynamics of graphene growth on Cu surfaces. J. Phys. Chem. C. 115, 17782-17787 (2011).
Zhang, B. et al. Low-temperature chemical vapor deposition growth of graphene from toluene on electropolished copper foils. ACS Nano 6, 2471-2476 (2012).
Zhang. Y. et al. Anisotropic hydrogen etching of chemical vapor deposited graphene. ACS Nano 6, 126-132 (2012).
Ajmal, M. et al. Fabrication of the best conductor from single-crystal copper and the contribution of grain boundaries to the Debye temperature. CryEngComm, 14, 1463-1467 (2012).
Wang, Y. et al. Electrochemical delamination of CVD-grown graphene film: toward the recyclable use of copper catalyst. ACS Nano 5, 9927-9933 (2011).
Liu, Y. et al. Cones, pringles, and grain boundary landscapes in graphene topology. Nano Lett. 10, 2178-2183 (2010).
L. Gao et al. Epitaxial Graphene on Cu(111), Nano Lett. 2010, 10, 3512-3516.
Y. A. Wu et al. Large Single Crystals of Graphene on Melted Copper Using Chemical Vapor Deposition, ACS Nano, 2012, 6, 5010-5017.
J. Gao et al. Graphene Nucleation on Transition Metal Surface: Structure Transformation and Role of the Metal Step Edge, J. Am. Chem. Soc. 2011, 133, 5009-5015.
V. I. Artyukhov et al. Equilibrium at the edge and atomistic mechanisms of graphene growth. Proc. Natl. Acad. Sci. USA 2012, 109, 15136-15140.
G. H. Han et al. Influence of Copper Morphology in Forming Nucleation Seeds for Graphene Growth, Nano Lett. 2011, 11, 4144-4148.
S. Saadi et al. On the Role of Metal Step-Edges in Graphene Growth, J. Phys. Chem. C 2010, 114, 11221-11227.
Gao et al., Repeated growth and bubbling transfer of graphene with millimetre-size single-crystal grains using platinum, Nature Communications, 2011 3:699, 1-7.
Sutter, et al., "Epitaxial graphene on ruthenium", Nature Materials vol. 7, May 2008, pp. 406-411.

\* cited by examiner

METHODS FOR PRODUCTION OF SINGLE-CRYSTAL GRAPHENES

CROSS-REFERENCE TO RELATED APPLICATIONS

This application claims priority to U.S. Provisional Patent Application No. 61/669,882, filed on Jul. 10, 2012. The entirety of the aforementioned application is incorporated herein by reference.

STATEMENT REGARDING FEDERALLY SPONSORED RESEARCH

This invention was made with government support under Grant No. FA9550-12-1-0035, awarded by the U.S. Department of Defense; Grant No. FA9550-09-1-0581, awarded by the U.S. Department of Defense; and Grant No. N00014-09-1-1066, also awarded by the U.S. Department of Defense. The government has certain rights in the invention.

BACKGROUND

Current methods of forming single crystals of graphene have numerous limitations in terms of efficiency, cost, bulk production, and quality. Therefore, improved methods of forming single crystals of graphene are desired for various applications.

SUMMARY

In some embodiments, the present disclosure pertains to methods of forming single-crystal graphenes. In some, the methods comprise: (1) cleaning a surface of a catalyst; (2) annealing the surface of the catalyst; (3) applying a carbon source to the surface of the catalyst; and (4) growing single-crystal graphene on the surface of the catalyst from the carbon source. In some embodiments, the formed graphene comprises a single layer of a single-crystal graphene. In some embodiments, the formed graphene comprises stacked layers of single crystals of graphene, such as bilayers and trilayers. In some embodiments, the stacked layers of single crystals of graphene form by repeating the applying and growing steps until a desired number of stacked layers are formed. In some embodiments, the methods of the present disclosure also include a step of controlling the morphology of the formed single crystals of graphene by adjusting various growth parameters.

In some embodiments, the catalyst is a copper foil. In some embodiments, the catalyst surface is cleaned by electrochemical-polishing. In some embodiments, the surface of the catalyst is annealed by thermal annealing at temperatures of about 500° C. or higher and pressures of about 1000 Torr or higher. In some embodiments, the thermal annealing occurs in a reductive environment that is under a stream of a reductive gas, such as hydrogen.

In some embodiments, carbon sources are applied onto a surface of a catalyst by chemical vapor deposition. In some embodiments, the carbon source is a hydrocarbon, such as methane.

In some embodiments, the single-crystal graphenes are grown at temperatures of about 500° C. or higher and pressures of about 100 Torr or higher. In some embodiments, the growing step takes about 2 hours or longer. In some embodiments, the growing occurs in a reductive environment that is under a stream of a reductive gas, such as hydrogen.

In some embodiments, the methods of the present disclosure may also include a step of separating the formed single-crystal graphene from the surface of the catalyst. In some embodiments, the methods of the present disclosure may also include a step of transferring the formed single-crystal graphene to a substrate.

BRIEF DESCRIPTION OF THE FIGURES

FIG. 3A is a drawing of the CP-CVD system, where a metering valve was added to precisely manipulate the chamber pressure ranging from 1 mT to 1500 Torr. FIG. 3B shows an optical image and scanning electron micrograph (SEM) images of single-crystal graphene monolayer domains. FIG. 3C shows a selected area electron diffraction (SAED) mapping protocol of the graphene transferred onto a transmission electron micrograph (TEM) grid. The diameter of the TEM grid was ~3 mm and the distance between the 9 adjacent selected points was ~0.5 mm. FIG. 3D shows 9 overlaid SAED patterns. The separate SAED patterns are shown in FIG. 5. FIG. 3E shows a high resolution transmission electron micrograph (HRTEM) image of a single-crystal graphene domain edge, verifying that it is monolayer.

In FIG. 4D, there are two rough edges to the graphene domain that arise from the mixtures of zigzag and armchair terminations. FIG. 4E is a plot of variations of the edge-to-edge distances of graphene domains as a function of the growth time. FIG. 4F shows the surface area of the graphene domains as a function of the growth time. The growth conditions for the graphene domains in FIGS. 4A-D are summarized as follows. Cu surfaces were first cleaned using the electrochemical-polishing method and then annealed at 1500 Torr and 1077° C. for 7 h with a $H_2$ flow rate of 500 sccm. After annealing, the $H_2$ flow rate was decreased to 70 sccm and the chamber pressure was adjusted to ~108 Torr by the metering valve. The graphene growth was started by introducing 0.15 sccm $CH_4$ into the chamber, with the $H_2$ held at 70 sccm for 10 min (FIG. 4A), 30 min (FIG. 4B), 60 min (FIG. 4C) and 125 min (FIG. 4D).

FIG. 6A is a typical SEM image of one graphene domain transferred onto $SiO_2$/Si. FIG. 6B is an enlarged SEM image of the yellow squared region in FIG. 6A. FIG. 6C shows an optical image taken from the corner of one graphene domain. FIG. 6D shows Raman maps of D peak, G peak and 2D peak. The Raman mapping is performed on the graphene corner shown in FIG. 6C. The data is extracted from D (1,350 cm$^{-1}$), G (1,580 cm$^{-1}$) and 2D (2,690 cm$^{-1}$) locations, as shown in FIG. 6E. The scale bar is 5 µm.

FIG. 7A is a typical SEM image of one monolayer domain with several smaller second- and third-layer graphene regions, after being transferred to SiO$_2$/Si. (FIGS. 7B-C). FIG. 7C shows the enlarged SEM images of the yellow and the red circled regions in FIG. 7A respectively, indicating a terraced structure. FIG. 7D shows Raman spectra of yellow, red and blue spots in FIG. 7C. The yellow spot in FIG. 7C displays I$_{2D}$/I$_G$=~3 and FWHM (2D)=~30 cm$^{-1}$, corresponding to monolayer graphene. The red and blue spots show I$_{2D}$/I$_G$=~1.2 and FWHM (2D)=55 cm$^{-1}$, and, I$_{2D}$/I$_G$=~0.7 and FWHM (2D)=75 cm$^{-1}$, respectively, suggesting increased graphene layers toward the center of the terraced structure. In FIGS. 7A-C, the domain shapes of the second- and third-layer graphene are hexagonal in shape, indicating that they are single-crystal. Meanwhile, their domains have different orientations compared to that of the underling monolayer graphene, suggesting the graphene in this terraced structure are twisted instead of showing Bernal stacking.

FIG. 8A shows an SEM image of a graphene Hall bar FET on a SiO$_2$/Si substrate. FIG. 8B shows resistivity of graphene versus the back gate voltage. FIG. 8C shows conductivity of graphene as a function of carrier density. The collected data is plotted as a black line while the data fitted by a Boltzmann model is indicated by the red filled circles. FIG. 8D is a plot of the density-dependent field effect mobility of graphene as a function of carrier density.

FIG. 9A shows a scheme for the Cu-based graphene growth mechanism. Here, red hexagons are used to symbolize the active sites of the Cu surface and blue spots signify active carbon species (CH$_{x<4}$)$_S$. From the proposed mechanism, the active carbon species from the dissociated CH$_4$ are apt to agglomerate into thermodynamically stable (C$_n$H$_y$)$_S$ species on the active sites of the Cu surface to initialize the graphene growth. FIGS. 9B-G show the typical SEM images of graphene synthesized under different growth conditions: FIG. 9B (E1), FIG. 9C (E2), FIG. 9D (E3), FIG. 9E (E4), FIG. 9F (E5) and FIG. 9G (E6).

FIG. 11A shows the SEM image of graphene after 1 min of growth, indicating the domain shapes are square and the domain sizes are ~15 µm. FIG. 11B shows graphene domains almost merge entirely after 2 min growth. FIG. 11C shows that a continuous graphene film was obtained after 3 min of growth. All scale bars are 0.5 mm.

FIG. 12A shows a scheme for Cu-surface electrochemical-polishing. FIGS. 12B-C show SEM images of fresh Cu and polished Cu, respectively, indicating electrochemical-polishing does not significantly affect Cu surface morphology. The scale bars in FIGS. 12B-C are 50 µm. FIG. 12D shows a variation of the electrochemical-polishing current as a function of the polishing time. The electrochemical-polishing voltage was 4.8 V. FIG. 12E shows additional optical images of Cu surfaces. After heating the samples at 215° C. in air for 1 min, fresh Cu was still shiny and polished Cu was completely oxidized, suggesting an oxide layer was removed during the electrochemical-polishing process.

FIG. 13A shows SEM images of graphene synthesized using E1 conditions on Cu, showing that there are many particles and wrinkles on the graphene surface. The particles arise from the oxide layer on the Cu surface, which cannot be completely removed during the annealing process. FIG. 13B shows SEM images of graphene grown using E7 conditions on Cu, suggesting the graphene is clean and flat. FIG. 13C shows AFM images that further demonstrate that as-grown graphene using E7 have a flatter and cleaner surface when compared to that of the as-grown graphene using E1. The oxide layer had been significantly removed during the electrochemical-polishing process (FIG. 12) and the wrinkles had been eliminated during the high-pressure annealing process (FIG. 17).

FIG. 14A is an SEM image of the graphene seed, suggesting that the shape is hexagonal and the size is ~100 µm. The scale bars in a and the inset of a are 1 mm and 10 µm, respectively. FIGS. 14B-E show the SEM images of the left, right, bottom and top sides of the same graphene seed in FIG. 14A, respectively, indicating that only one graphene seed was found in ~1 cm×1 cm Cu. The yellow squared regions in FIGS. 14B-E are the same graphene seed as shown in FIG. 14A. The scale bars in FIGS. 14B-E are 1 mm. The black circled spots in FIGS. 14A, C and E are the same one, and not graphene or growing carbon. The quality of as-grown graphene was evaluated by Raman spectroscopy. No D peak was observed in the recorded Raman spectra, indicating its high quality. The edge-to-edge growth speed of the graphene domain under E8 is ~1 µm·min$^{-1}$, much slower than that of the graphene domain under E7 (~18 µm·min$^{-1}$), suggesting that the growth speed of graphene could be reduced by increasing the flow rate ratio of H$_2$/CH$_4$.

FIG. 15A is an SEM image of graphene obtained using E10 conditions with domain sizes of ~100 µm. FIG. 15B is an SEM image of graphene obtained using E11 conditions with domain sizes of ~200 µm. The scale bars in FIGS. 15A-B are 0.5 mm and 1 mm, respectively.

FIG. 17A shows a scheme for high-pressure annealing of Cu. FIGS. 17B-E show SEM images of high-pressure annealed Cu under different magnifications, suggesting the Cu surface became flat and the sharp wrinkles and defects were removed as compared to fresh Cu (FIG. 12B) and polished Cu (FIG. 12C). The scale bars in FIGS. 17B-E are 1 mm, 300 µm, 30 µm and 1 µm, respectively. Here, the annealing pressure was 1500 Torr, the annealing time was 7 h, the annealing temperature was 1077° C. and the $H_2$ flow rate was 500 sccm.

FIG. 18A shows a scheme of bi- and trilayer graphene domains synthesized on pretreated Cu, which were fabricated via a double-annealing procedure described in Example 2. FIGS. 18B-G show representative optical images of as-made bi- and trilayer graphene domains transferred onto $SiO_2$ (100 nm)/Si substrates, indicating that monolayer, bilayer and trilayer are all hexagons and have well-defined 0° or 30° interlayer stacking orientations. The scale bars in FIGS. 18B-G are 30 µm. Assuming orientation angles of monolayer hexagons in all few-layer graphene domains are 0° and depending on different bi- and trilayer stacking orders, there are two types of bilayer domains (FIG. 18B (0-0) and FIG. 18C (0-30)), and four types of trilayer domains (FIG. 18D (0-0-0), FIG. 18E (0-0-30), FIG. 18F (0-30-0) and FIG. 18G (0-30-30)).

FIG. 20A shows an optical image of a 0-0 bilayer graphene domain. FIG. 20B shows Raman spectra recorded from point A and B in FIG. 20A. The 2D peak of point B displays an asymmetric line shape and can be well-fitted by four components (FIG. 24). FIG. 20C shows a typical SAED pattern taken from the bilayer region of 0-0 bilayer graphene domains, showing only one set of diffraction patterns. FIG. 20D shows one typical optical image of 0-30 bilayer graphene domains. FIG. 20E shows Raman spectra recorded from points C and D in panel d. FIG. 20F shows a typical SAED pattern taken from the bilayer region of 0-30 bilayer graphene domains, showing a 30° rotation between the two stacking layers. FIG. 20G shows a representative reflection spectrum by FT-IR with synchrotron radiation recorded from the bilayer region of 0-0 bilayer graphene domains, showing a dip around 350 meV. FIG. 20H shows a representative reflection spectrum by FT-IR with synchrotron radiation recorded from the bilayer region of 0-30 bilayer graphene domains. The FT-IR spectra were normalized to the reflection spectrum of the substrate, $SiO_2$ (300 nm)/Si.

As shown in FIG. 23A, monolayer graphene domains, dotted with several small bilayer domains, could be occasionally observed in the growth process, indicating that the monolayer region and the several bilayer regions did not share the same nucleation site in this special case.

FIG. 25A shows representative SAED patterns taken from the bilayer region of 0-0 bilayer graphene domains. FIG. 25B shows the intensity profile from the SAED pattern in panel a. The (1-210) intensity was ~3 times stronger than the (1-100), indicating the graphene is Bernal-stacked bilayer.

FIGS. 26A-B shows typical optical images and Raman spectra of N-doped 0-30 and 0-0 bilayer graphene domains. Optical images demonstrate that N-doped graphene domains have hexagonal shapes. Large D peaks were present in the Raman spectra of both mono- and bilayer regions, indicating nitrogen was successfully doped into the matrix of graphene. FIG. 26C shows x-ray photoelectron spectroscopy (XPS) analysis of N 1s peak and C 1s peak on N-doped graphene, showing the nitrogen content is ~3%. N-doped graphene domains were synthesized using the same procedures as described in Example 2 by just introducing ~0.5 sccm $NH_3$ during the graphene growth process. The XPS characterization was conducted on the continuous graphene film by extending the growth time to 3 h.

FIG. 27A is a schematic of graphene nucleation on a Cu step. The C atoms are represented by black spheres, and the Cu are shown in red, where the topmost Cu layer is highlighted in bold color. FIG. 27B shows the orientation angle between graphene and Cu(111) surface. FIG. 27C shows the relaxed atomic structure of graphene-Cu step interfaces for different orientation angles. FIG. 27D shows the graphene-Cu step interface energy (defined in Eq. 1 in Example 2) as a function of orientation angle. The two data points at the same orientation angle represent the computational accuracy, due to different strain levels of periodic cell size (either using the Cu lattice parameter or graphene lattice parameter; see details in Example 2).

FIG. 28A is a representative SEM image of fresh Cu, showing sharp wrinkles. FIG. 28B is a representative SEM image of high-pressure annealed Cu without polishing, demonstrating particle contamination on the surface which were from the reduction of the Cu protection layer. FIG. 28C is a representative SEM image of polished and high-pressure annealed Cu, showing a flat and clean surface. Cu step edges cannot be detected by SEM or AFM, which generally exist on the Cu surface and are usually characterized on the ultraflat single-crystal Cu by STM.

FIG. 32A depicts the beginning of growth, where the concentration of carbon atoms on substrate increases up to a threshold value of c*, whereupon first-generation islands nucleate. FIG. 32B shows that the concentration of carbon atoms on substrate is depleted by the growing edges of the island (equilibrium concentration, $c_{eq}$) while the stabilization of atoms under the island allows a buildup causing a secondary nucleation event under the first layer. FIG. 32C shows third-generation islands can only form under the second (bottom) layer, resulting in the observed concentric shapes.

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise. Parameters disclosed herein (e.g., temperature, time, concentrations, etc.) may be approximate.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Mechanically exfoliated graphene demonstrates extraordinary electrical and physical properties that could be harnessed to enable exceptional advances in technology. However, the initially reported micromechanical exfoliation of highly oriented pyrolytic graphite can only yield a minute amount of small single-crystal graphene, limiting the practicality of this method. Recently developed chemical vapor deposition (CVD) methods could produce large-size and uniform polycrystalline graphene, but the electronic properties of CVD graphene are degraded by domain boundaries. Thus, the fabrication of large-size single-crystal graphene using CVD on various catalysts (e.g., transition metals, especially on Cu) has attracted much interest among materials scientists.

In particular, there have been advancements in the growth of Cu-based single-crystal graphene. For example, ~10 µm-sized self-arrayed single-crystal graphene domains were fabricated by pre-patterning seeds on Cu. Using such methods, ~100 µm-sized hexagonal single-crystal graphene domains were made on melted Cu. Sub-millimeter single-crystal graphene was also successfully synthesized by pre-annealing of Cu at atmospheric pressure or using a Cu enclosure for graphene growth. ~100 µm-sized single-crystal graphene flowers were also made by trapping vapor growth on Cu and controlling pressure. Finally, the growth of millimeter-sized single-crystal graphene was recently achieved on Pt and Ni. However, the facile synthesis of graphene with larger single-crystal domains on various catalysts (e.g., commercial Cu) remains desirable.

Figure 1:
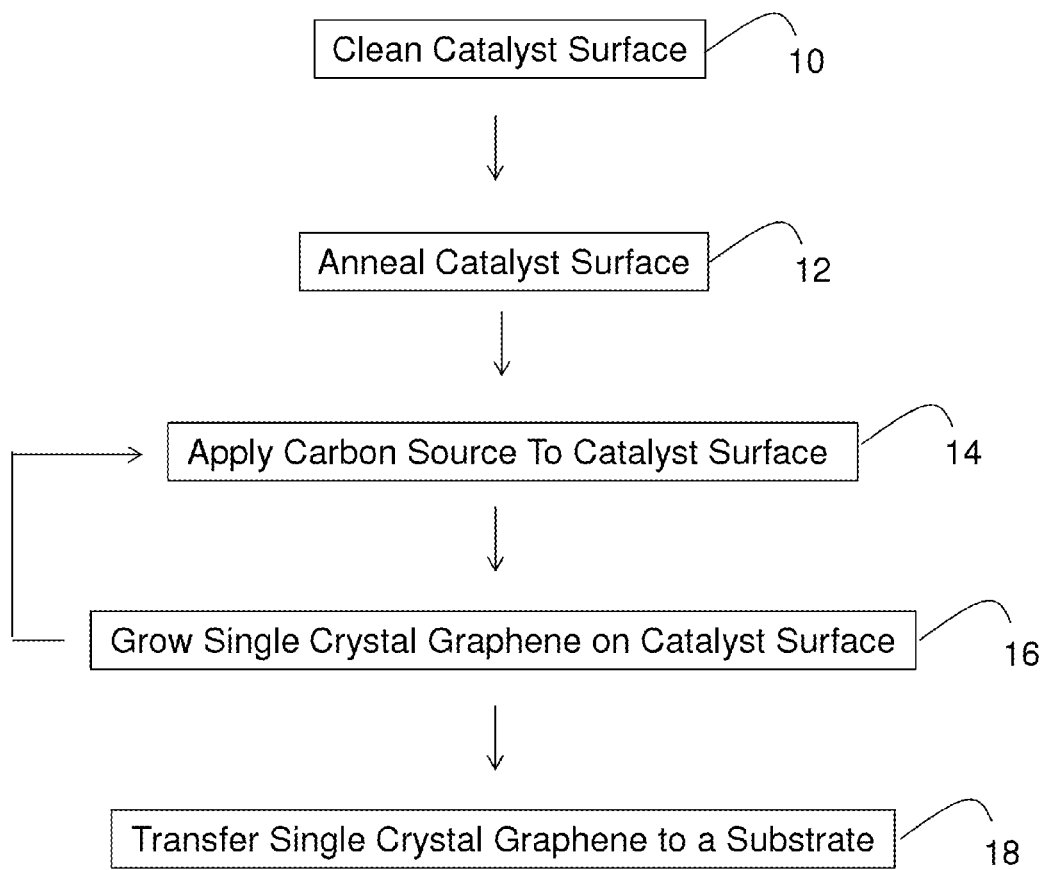
FIG. 1 provides a scheme of a method for production of single-crystal graphene.

Various embodiments of the present disclosure pertain to systems and methods of forming single-crystal graphene. As set forth in the scheme in FIG. 1, such methods can include: cleaning a surface of a catalyst (step 10); annealing the surface of the catalyst (step 12); applying a carbon source to the surface of the catalyst (step 14); and growing single-crystal graphene on the surface of the catalyst from the carbon source (step 16). In further embodiments, the formed single-crystal graphene can be transferred to a surface of a substrate (step 18). In some embodiments, steps 14 and 16 may be repeated to form multiple stacked layers of single crystals of graphene.

Figure 2:
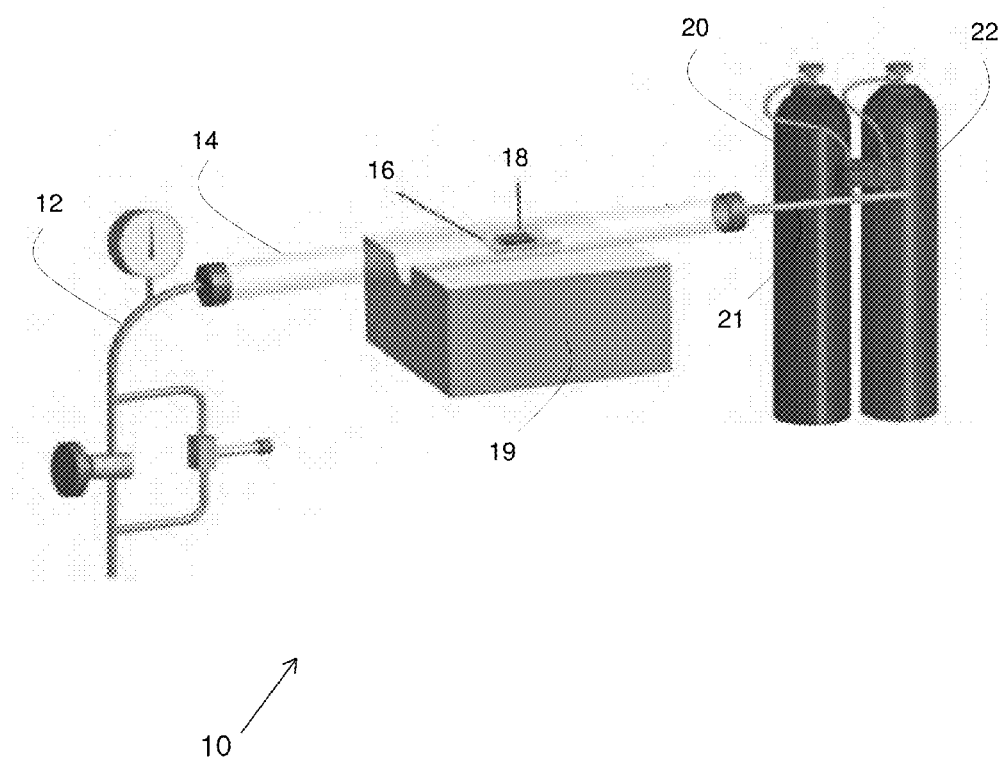
FIG. 2 provides an illustration of an apparatus for production of single-crystal graphene.

In addition, various systems may be utilized to form single-crystal graphenes in accordance with the methods of the present disclosure. For instance, as illustrated in the diagram in FIG. 2, system 10 may be utilized in some embodiments to form single-crystal graphenes. System 10 generally includes pressure control system 12, tube 14, furnace 19, carbon source 20 (e.g., $CH_4$), and reductive gas source 22 (e.g., $H_2$). Carbon source 20 and reductive gas source 22 are in controllable contact with tube 14 through tubing 21. Likewise, pressure control system 12 is in direct contact with tube 14 in this embodiment. In operation, catalyst 18 is cleaned. Catalyst 18 is then placed on catalyst holder 16 in tube 14 and moved to a position above furnace 19. A steady stream of reductive gas is then applied to tube 14 from reductive gas source 22 through tubing 21. Thereafter, the surface of catalyst 18 is thermally annealed by increasing the temperature of furnace 19 (e.g., above 1000° C.) and increasing the pressure of tube 14 (e.g., above 1500 Torr) through the use of pressure control system 12. After a suitable amount of thermal annealing time (e.g., 7 hours), the pressure of tube 14 is reduced (e.g., to about 100 Torr). Thereafter, a steady stream of carbon source is applied to the surface of catalyst 18 through carbon source 20 and tubing 21. Under such conditions, the growth of single-crystal graphene occurs after a suitable amount of time (e.g., 2 hours).

As set forth in more detail herein, the methods and systems of the present disclosure can have various embodiments. For instance, in addition to system 10 illustrated in FIG. 2, various other systems may be utilized to form single-crystal graphene in accordance with the methods of the present disclosure. Moreover, the methods of the present disclosure may utilize various types of catalysts. In addition, various methods may be utilized to clean and anneal catalyst surfaces. Likewise, various methods may be utilized to apply various types of carbon sources onto cleaned and annealed catalyst surfaces. In addition, various growth conditions may be utilized to form various types of single-crystal graphenes. The formed single-crystal graphenes may also be separated from the catalyst surface or transferred onto another surface by various methods.

Catalysts

Various catalysts may be utilized to form single-crystal graphenes. In some embodiments, the catalyst may include at least one of Ni, Co, Fe, Pt, Au, Al, Cr, Cu, Mg, Mn, Mo, Rh, Si, Ta, Ti, W, U, V and Zr, mixtures thereof, foils thereof, vapor deposited metals thereof, and combinations thereof. In some embodiments, the catalysts may include reduced metal catalysts, oxidized metal catalysts, associated alloys of metal catalysts, and combinations thereof. In more specific embodiments, the catalyst is a copper foil.

The catalysts of the present disclosure may also have various purities. For instance, in some embodiments, the catalysts of the present disclosure may have a purity of at least about 75%. In some embodiments, the catalysts of the present disclosure may have a purity of at least about 95%. In some embodiments, the catalysts of the present disclosure may have a purity of at least about 99%. In more specific embodiments, the catalyst is a copper foil with a purity above 99%.

The catalysts of the present disclosure may also be in various crystalline forms. For instance, in some embodiments, the catalysts of the present disclosure may be in monocrystalline form. In some embodiments, the catalysts of the present disclosure may be in polycrystalline form. In more specific embodiments, the catalysts of the present disclosure include polycrystalline copper foils.

The catalysts of the present disclosure may also have various shapes. For instance, in some embodiments, the catalysts of the present disclosure may be in the form of squares, rectangles, cylinders, circles, and the like. In some embodiments, the catalysts of the present disclosure may have at least one surface. In some embodiments, the catalysts of the present disclosure may have multiple surfaces. As set forth in more detail herein, various methods may be utilized to clean and anneal catalyst surfaces.

Cleaning of Catalyst Surfaces

Various methods may be utilized to clean catalyst surfaces. For instance, in some embodiments, catalyst surfaces may be cleaned by treatment with one or more acids. In some embodiments, the one or more acids may include sulfuric acid, nitric acid, hydrochloric acid, acetic acid, diluted acids, and combinations thereof.

In some embodiments, the cleaning of the catalyst surface may include electrochemical-polishing of the surface of the catalyst. In some embodiments, the electrochemical-polishing may include applying a voltage to the catalyst surface and polishing the catalyst surface for a certain amount of time. For instance, in more specific embodiments, electrochemical polishing may include applying a voltage of about 0.5 V or higher to the surface of the catalyst, and polishing the surface of the catalyst for about 10 seconds or longer.

In some embodiments, the cleaning of catalyst surfaces may occur by mechanical polishing. Additional methods of cleaning catalyst surfaces can also be envisioned.

Annealing of Catalyst Surfaces

Various methods may also be used to anneal catalyst surfaces. For instance, in some embodiments, the annealing of catalyst surfaces includes thermal annealing. In some embodiments, thermal annealing includes exposure of a catalyst surface to temperatures of about 500° C. or higher. In some embodiments, thermal annealing includes exposure of a catalyst surface to temperatures of about 1000° C. or higher.

In some embodiments, the annealing of catalyst surfaces may occur at various pressures. For instance, in some embodiments, the annealing of catalyst surfaces may occur at pressures that range from about 1 mTorr to about 1500 Torr. In some embodiments, the annealing of catalyst surfaces occurs at pressures of about 1000 Torr or higher. In some embodiments, the annealing of catalyst surfaces occurs at pressures at or above 1500 Torr.

In some embodiments, the annealing of catalyst surfaces may occur in a reductive environment. For instance, in some embodiments, the annealing of catalyst surfaces may occur under a stream of a reductive gas, such as hydrogen. In some embodiments, the annealing of catalyst surfaces may occur under a stream of a reductive gas at a flow rate of about 100-1000 standard cubic cm per minute (sccm). In more specific embodiments, the annealing of catalyst surfaces occurs under a stream of hydrogen gas at a flow rate of about 500 sccm.

The annealing of catalyst surfaces may also occur for various time periods. In some embodiments, the annealing of catalyst surfaces may last from about 1 minute to about 10 hours. In some embodiments, the annealing of catalyst surfaces may last for about 7 hours.

In more specific embodiments, the annealing of catalyst surfaces can involve exposure of a surface of a catalyst to a temperature of about 500° C. or higher and a pressure of about 1 mT or higher for more than about 1 minute. In more specific embodiments, the annealing temperature is at least about 1000° C., the annealing pressure is at least about 1500 Torr, and the annealing time is at least about 7 hours.

In some embodiments, the annealing of catalyst surfaces may occur under inert conditions, such as under a stream of one or more inert gases. In some embodiments, the one or more inert gases may include, without limitation, argon, nitrogen, and combinations thereof. In some embodiments, the annealing of catalyst surfaces may occur under inert and reductive conditions. For instance, in some embodiments, the annealing of catalyst surfaces may occur under streams of one or more inert gases (e.g., Ar, $N_2$, etc.) and one or more reductive gases (e.g., $H_2$). Additional methods of annealing catalyst surfaces can also be envisioned.

Applying Carbon Sources to Catalyst Surfaces

Various methods may also be utilized to apply carbon sources to catalyst surfaces. In some embodiments, carbon sources are applied above catalyst surfaces by spin-coating, drop-casting, spray coating, dip coating, physical application, vapor-coating, sublimation, blading, inkjet printing, screen printing, direct placement, thermal evaporation, chemical vapor deposition, and combinations thereof. In more specific embodiments, carbon sources are applied above catalyst surfaces by chemical vapor deposition (CVD).

In addition, various carbon sources may be applied to catalyst surfaces. For instance, in some embodiments, the carbon source may include at least one of hydrocarbons, polymers, non-polymeric carbon sources, small molecules, organic compounds, fullerenes, fluorenes, carbon nanotubes, phenylene, ethylenes, sucrose, sugars, polysaccharides, carbohydrates, proteins, and combinations thereof. In some embodiments, the carbon sources may include polymers, such as poly(methyl methacrylate)s, polystyrenes, polyacrylonitriles, polycarbonates, poly(phenylene ethylene)s, cellulose, and combinations thereof.

In more specific embodiments, the carbon sources that are applied to catalyst surfaces include hydrocarbons. In some embodiments, the hydrocarbons include, without limitation, $CH_4$, $C_2H_4$, $C_2H_2$, and combinations thereof. In some embodiments, the hydrocarbons include methane.

In additional embodiments, the applying of the carbon source to a catalyst surface may also include an application of a dopant to the catalyst surface. In some embodiments, the dopant may include, without limitation, a nitrogen source (e.g., ammonia), a boron source (e.g., borane), and combinations thereof. In some embodiments, the dopant is a nitrogen source, such as ammonia. In some embodiments, the applying of the nitrogen source to the catalyst surface along with a carbon source can lead to the formation of N-doped single crystal graphenes. In some embodiments, the dopant is a boron source, such as borane. In some embodiments, the applying of the boron source to the catalyst surface along with a carbon source can lead to the formation of B-doped single-crystal graphenes. In some embodiments, the dopant may include both a nitrogen and a boron source. In such embodiments, the application of the dopant to the catalyst surface along with a carbon source can lead to the formation of B-doped and N-doped single-crystal graphenes (i.e., BCN).

In more specific embodiments, the applying of the carbon source to a catalyst surface includes the application of hydrocarbons to the catalyst surface by CVD. Additional methods of applying carbon sources to catalyst surfaces can also be envisioned.

Growth of Single-Crystal Graphenes on Catalyst Surfaces

Growth of single-crystal graphene on catalysts surfaces generally occurs during or after the application of a carbon source onto a catalyst surface. Various methods may also be utilized to grow various types of single-crystal graphenes on catalyst surfaces. In particular, various pressures, temperatures, growth times, and environmental conditions may be utilized to grow single-crystal graphenes on catalyst surfaces.

For instance, in some embodiments, the growth of single-crystal graphene on catalyst surfaces occurs in a reductive environment. In some embodiments, the reductive environment may include a stream of a reductive gas, such as hydrogen. In some embodiments, the stream of the reductive gas may have a flow rate of about 100 sccm to 1000 sccm. In more specific embodiments, growth of single-crystal graphene on catalyst surfaces occurs under a stream of hydrogen gas at a flow rate of about 70 sccm.

In some embodiments, the growth of single-crystal graphene on catalyst surfaces may occur under inert conditions, such as under a stream of one or more inert gases. In some embodiments, the one or more inert gases may include, without limitation, argon, nitrogen, and combinations thereof. In some embodiments, the growth of single-crystal graphene on catalyst surfaces may occur under inert and reductive conditions. For instance, in some embodiments, the growth of single-crystal graphene may occur under streams of one or more inert gases (e.g., Ar, $N_2$, etc.) and one or more reductive gases (e.g., $H_2$).

The growth of single-crystal graphene on catalyst surfaces may also occur at various pressures. For instance, in some embodiments, the growth of single-crystal graphene on catalyst surfaces may occur at pressures that range from about 1 mTorr to about 1500 Torr. In more specific embodiments, the growth of single-crystal graphene on catalyst surfaces occurs at pressures at or about 100 Torr to about 110 Torr (e.g., 108 Torr).

The growth of single-crystal graphene on catalyst surfaces may also occur at various temperatures. For instance, in some embodiments, the growth of single-crystal graphene on catalyst surfaces occurs at temperatures of about 500° C. or higher. In some embodiments, the growth of single-crystal graphene on catalyst surfaces occurs at temperatures of about 1000° C. or higher.

In addition, the growth of single-crystal graphene on catalyst surfaces may occur for various time periods. For instance, in some embodiments, the growth of single-crystal graphene on catalyst surfaces may last from about 1 minute to about 10 hours. In some embodiments, the growth of single-crystal graphene on catalyst surfaces may last for about 2 hours (e.g., 125 minutes).

Single-Crystal Graphenes

The methods of the present disclosure may be utilized to grow various types of single-crystal graphenes. For instance, in some embodiments, the formed single-crystal graphenes may have a single layer. In some embodiments, single-crystal graphenes may have diameters that range from about 0.1 μm to about 5 meters, or from about 500 μm to about 5 meters. In some embodiments, the single-crystal graphenes may have diameters that range from about 5 μm to about 500 mm. In some embodiments, the single-crystal graphenes may have diameters that range from about 1 mm to about 5 mm.

The single-crystal graphenes can also have various shapes. For instance, in some embodiments, the single-crystal graphenes may include at least one of hexagons, tetragons or other kinds of polygons. In some embodiments, the single-crystal graphenes may be hexagonally shaped. In some embodiments, the single-crystal graphenes may have straight edges and well-identifiable corners.

The single-crystal graphenes formed in accordance with the methods of the present disclosure may also have various layers. For instance, in some embodiments, the formed single-crystal graphenes include a single layer. In some embodiments, the formed single-crystal graphenes include multiple stacked layers of single crystals of graphene. In some embodiments, the stacked layers of single crystals of graphene may include bilayers or trilayers. In some embodiments, the stacked layers of single crystals of graphenes may include anywhere from 2 layers to 100 layers. In some embodiments, the single crystals of graphene in the stacked layers may have diameters that range from about 0.1 μm to about 5 meters, from about 10 μm to about 5 meters, or from about 5 μm to about 500 mm.

In some embodiments, the stacked layers of single crystals of graphene are formed by repeating various steps of the methods of the present disclosure. For instance, in some embodiments, the applying and growing steps of the methods of the present disclosure may be repeated until a desired number of stacked layers of single crystals of graphene are formed.

Control of Single-Crystal Graphene Morphology

In further embodiments, the methods of the present disclosure may also include a step of controlling the morphology of the single-crystal graphenes by adjusting various growth parameters. In some embodiments, the controllable aspects of single-crystal graphene morphology may include at least one of shape, size, diameter, and thickness. In some embodiments, the adjustable growth parameters that may be used to control the morphology of single-crystal graphenes may include, without limitation, flow rate of a reductive gas during growth, growth time, growth temperature, annealing temperature, growth pressure, type of catalyst used, and combinations thereof.

Separation or Transfer of Single-Crystal Graphenes

In various embodiments, the methods of the present disclosure may also include a step of separating formed single-crystal graphenes from a surface of a catalyst. In some embodiments, the separating occurs by various processes. Such processes may include, without limitation, thin film protection, acid-etching, film lift off, and combinations thereof.

In some embodiments, the methods of the present disclosure may also include a step of transferring the formed single-crystal graphene from a surface of a catalyst onto another surface. In some embodiments, the formed single-crystal graphene is transferred to a substrate, such as a $SiO_2$/Si wafer.

Applications and Advantages

The methods of the present disclosure provide numerous applications and advantages. For instance, the methods of the present disclosure can be used to produce large-scale (e.g., wafer-scale) single-crystal graphenes with uniform thicknesses and low defects. In addition, the methods of the present disclosure can be used to control the morphology (e.g., size and shape) of the single-crystal graphenes. Moreover, the methods of the present disclosure can be used to transfer the formed single-crystal graphenes onto various surfaces without damaging the single-crystal graphenes.

Furthermore, the methods of the present disclosure can be used to grow single-crystal graphenes without the use of a vacuum (e.g., ultra-high vacuum). For instance, the methods of the present disclosure can occur under positive pressure, such as pressures greater than 760 Torr, pressures greater than 1000 Torr, and pressures greater than 1500 Torr. Likewise, the methods of the present disclosure may not require the use of highly purified catalysts, single crystal metals, extremely low carbon concentrations, or noble metal substrates (e.g., Pt).

As such, the methods of the present disclosure provide controllable, convenient, low cost, and large-scale methods of growing single-crystal graphenes that can be readily transferred to various surfaces. Therefore, Applicants envision that the methods of the present disclosure can provide numerous applications. For instance, in some embodiments, the methods of the present disclosure may be utilized for the optimal fabrication of various graphene devices. In more specific embodiments, the methods of the present disclosure can be utilized for the fabrication of electrical devices that include a graphene domain, such as electrical devices that show ambipolar behavior. In further embodiments, single-crystal graphenes formed in accordance with the methods of the present disclosure can be fabricated into basic electronic devices, such as field-effect transistors (FET), transparent electrodes, photovoltaic devices, liquid crystal display devices, and touch screens.

Additional Embodiments

Reference will now be made to various embodiments of the present disclosure and experimental results that provide support for such embodiments. However, Applicants note that the disclosure herein is for illustrative purposes only and is not intended to limit the scope of the claimed subject matter in any way.

EXAMPLE 1

Synthesis of Wafer-Scale Single-Crystal Graphene on Copper Foil

Figure 3:
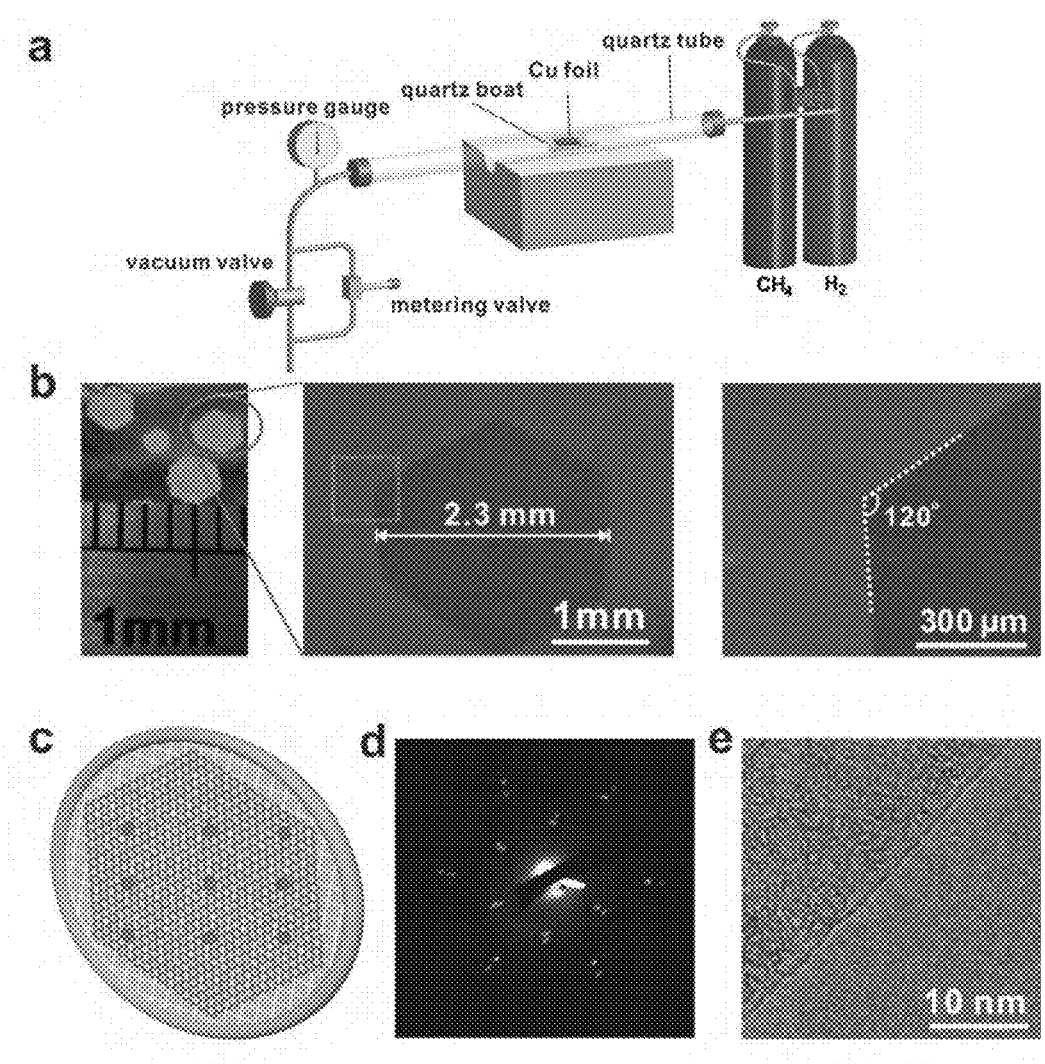
FIG. 3 provides schemes and data relating to the synthesis of large-size (~2.3 mm) single-crystal graphene monolayer domains by using a controlled pressure chemical vapor deposition (CP-CVD) system.

In this Example, Applicants constructed a controlled chamber pressure chemical vapor deposition (CP-CVD) system to manipulate graphene's domain sizes and shapes. Using this system, Applicants synthesized large ($\sim$4.5 mm$^2$) single-crystal hexagonal monolayer graphene domains on commercial polycrystalline Cu foils (99.8% purity), indicating its potential feasibility on a large scale at low cost (high-purity Cu (99.999%) was also used in some experiments). The as-synthesized graphene had a mobility of positive charge carriers of $\sim$11,000 cm$^2$V$^{-1}$s$^{-1}$ on a SiO$_2$/Si substrate at room temperature, suggesting its comparable quality to that of exfoliated graphene. The growth mechanism of Cu-based graphene was explored by studying the influence of varied growth parameters on graphene domain sizes. Cu pretreatments, electrochemical polishing and high-pressure annealing are shown to be desirable for suppressing graphene nucleation site density. A pressure of 108 Torr was the optimal chamber pressure for the synthesis of large single-crystal monolayer graphene. The synthesis of one graphene seed was achieved on centimeter-sized Cu foils by optimizing the flow rate ratio of H$_2$/CH$_4$. Research grade CH$_4$ (99.999% purity, Matheson) and ultra-high purity H$_2$ (99.999% purity, Matheson) were utilized. While the CVD chamber pressure is an important parameter for controlling graphene growth, most present research is focused on low-pressure and atmospheric-pressure CVD growth. In this Example, Applicants constructed a CP-CVD system by adding a metering valve, as shown in FIG. 3A, which can be used to precisely manipulate the chamber pressure, ranging from 1 mT to 1500 Torr. This modification allows Applicants to adjust the chamber pressure during the annealing or growth process to control the shapes and sizes of graphene domains.

Using this system, the synthesis of large-size ($\sim$4.5 mm$^2$) single-crystal monolayer graphene on Cu was achieved as follows. Cu surfaces were first cleaned using the electrochemical-polishing method (see Example 1.3) and then annealed at 1500 Torr and 1077° C. for 7 h with a H$_2$ flow rate of 500 standard cubic cm per min (sccm). After annealing, the flow rate of H$_2$ was decreased to 70 sccm and the chamber pressure was adjusted to $\sim$108 Torr by the metering valve. The graphene growth was started by introducing 0.15 sccm CH$_4$ into the chamber, with the H$_2$ held at 70 sccm, for 125 min. After the reaction, the Cu foils were quickly removed from the hot zone of the CVD furnace and permitted to cool to room temperature. This growth was performed on commercial polycrystalline Cu foils (99.8% purity, Alfa Aesar) without needing extremely low CH$_4$ concentrations, a noble metal substrate such as Pt, or ultra-high vacuum, indicating that this is a feasible and practical method for the scalable production of large-size single-crystal graphene at low cost.

After the graphene growth, the Cu foils were heated in air for 1 min at 215° C.; the oxidation of Cu foils makes the graphene domains optically visible. FIG. 3B is a typical optical image of a Cu surface after the graphene growth, showing four graphene domains in this $\sim$7 mm×7 mm area. Three of the domains are $\sim$2.3 mm and the middle domain is $\sim$1 mm, suggesting the graphene nucleus related to these four graphene domains did not form simultaneously. The SEM images in FIG. 3B shows that the obtained graphene domain is hexagonally shaped, has straight edges and well-identifiable 120° corners. Its edge-to-edge distance is $\sim$2.3 mm and the surface area is $\sim$4.5 mm$^2$, more than 20 times larger than the best reported results on Cu. Rough edges are sometimes observed in graphene domains (FIG. 4) and arise from the mixture of zigzag and armchair terminations.

Figure 4:
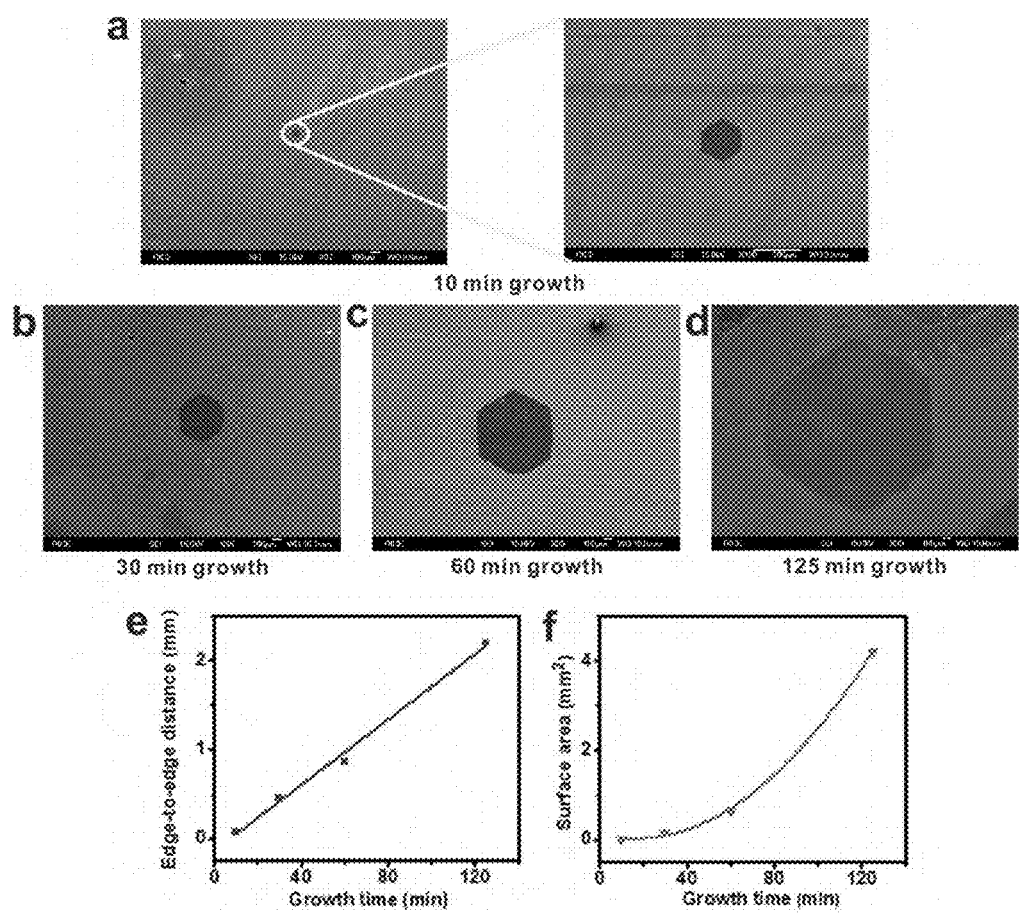
FIG. 4 shows SEM images of graphene domains grown at different times. SEM images show graphene domains grown for 10 min (FIG. 4A), 30 min (FIG. 4B), 60 min (FIG. 4C) and 125 min (FIG. 4D) in four different experiments. In the SEM images, only one graphene domain was found in a ~3 mm×3 mm area. The scale bar is 100 µm in all figures.

In four different experiments, Applicants halted the reactions after 10, 30, 60 or 125 min, respectively, as shown in FIG. 4. In all of these cases, only one graphene domain was found in the $\sim$3 mm×3 mm region (FIGS. 4A-D). The growth rates were estimated from the SEM images and demonstrated in FIGS. 4E-F. The growth rate of edge-to-edge distance is relatively uniform, $\sim$18 μm·min$^{-1}$ under these experimental conditions (FIG. 4E). However, FIG. 4F indicates that the surface areas of graphene domains had an accelerated growth rate. This can be understood by the fact that, with the increase in the perimeters of the graphene domains, greater graphene edge-lengths are exposed to the Cu foil, consequently leading to an increase in the amount of active carbon species captured by graphene edges per unit time.

Figure 5:
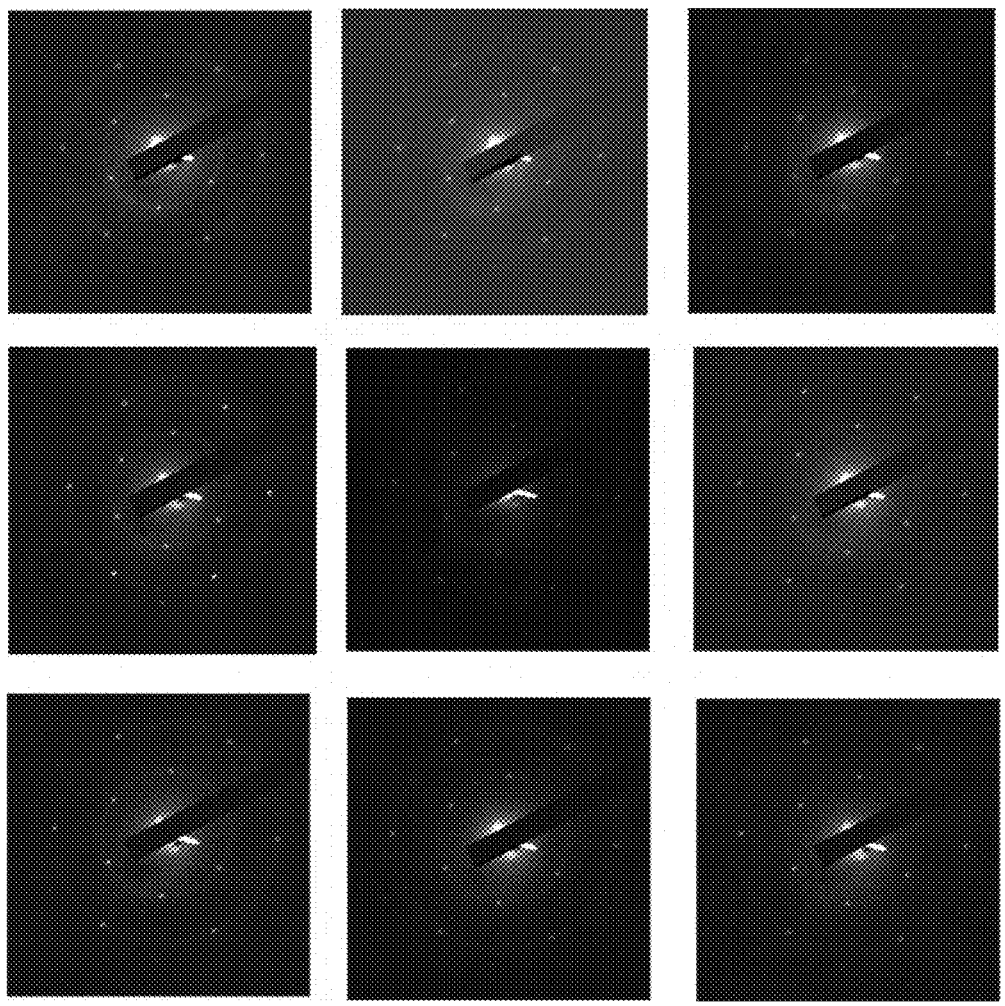
FIG. 5 shows additional SAED patterns from the graphene domain transferred on the TEM grid in FIG. 3C. The SAED patterns were recorded from 9 points over the graphene domain shown in FIG. 3C. The SAED patterns demonstrate that these points have the same orientations. The distance between adjacent points was ~0.5 mm.

Selected area electron diffraction (SAED) patterns have been widely used to characterize small-size single-crystal graphene domains. However, a single SAED pattern analysis only covers a μm-sized area of graphene. In order to analyze these large-size graphene domains, a SAED mapping pattern was performed across the entire graphene and 9 different points were selected, as shown in FIG. 3C. The distance between adjacent points is $\sim$0.5 mm. All of the SAED patterns of these 9 points had the same orientations (FIG. 5) and were overlaid to produce a combined pattern (FIG. 3D), indicating a single-crystalline lattice structure. The slight offset in the SAED patterns is occasionally observed because of the intrinsic corrugation in the graphene flake or accidental folding introduced during the transfer. The high-resolution TEM (HRTEM) image in FIG. 3E was randomly taken from numerous graphene domain edges. The layer count on the edge of the HRTEM image indicates as-grown graphene is monolayered.

As-produced graphene was transferred onto $SiO_2/Si$ wafers for further characterization (see Example 1.4). FIG. 6A is a typical SEM image of the graphene domain on the $SiO_2/Si$ wafer. FIGS. 6B-C are the SEM and optical images taken from corners of different graphene samples. The clean surfaces shown in FIGS. 6A-C demonstrate that residual PMMA has been removed following the transfer process. All of these SEM and optical images demonstrate uniform color contrast, suggesting that uniform monolayer graphene was obtained. The straight edges and 120° corners indicate that the original shapes of the transferred graphene samples are preserved.

Figure 6:
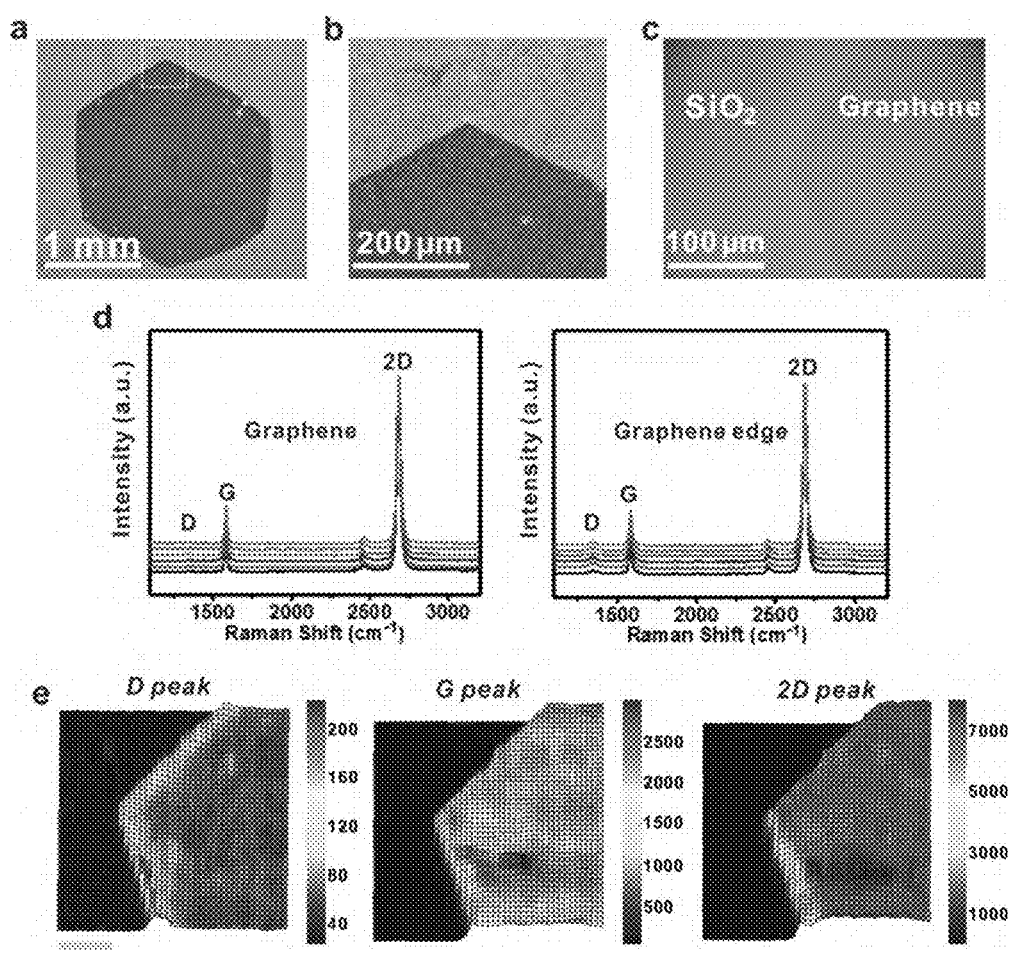
FIG. 6 shows SEM and Raman spectroscopy characterizations of graphene domains transferred to $SiO_2$/Si wafers.

Raman spectroscopy was done on the transferred graphene samples to evaluate their quality and thickness. FIG. 6D shows the Raman spectra recorded at 12 different spots from the graphene in FIG. 6A, 6 within the graphene and 6 over the graphene edge. The Raman spectra indicate that the D peaks within the graphene are in the noise level, signifying the presence of few defects and that it has high quality, comparable to that of the exfoliated graphene. The D peaks recorded from the graphene edges are slightly higher than those within the graphene, and are thought to arise from the lower symmetry of the edges. In all these 12 Raman spectra, the intensities of 2D peaks are more than twice those of G peaks and the full widths at half-maximum (FWHM) of the 2D peaks are ~30 $cm^{-1}$, suggesting the as-produced samples are monolayer graphene.

Figure 7:
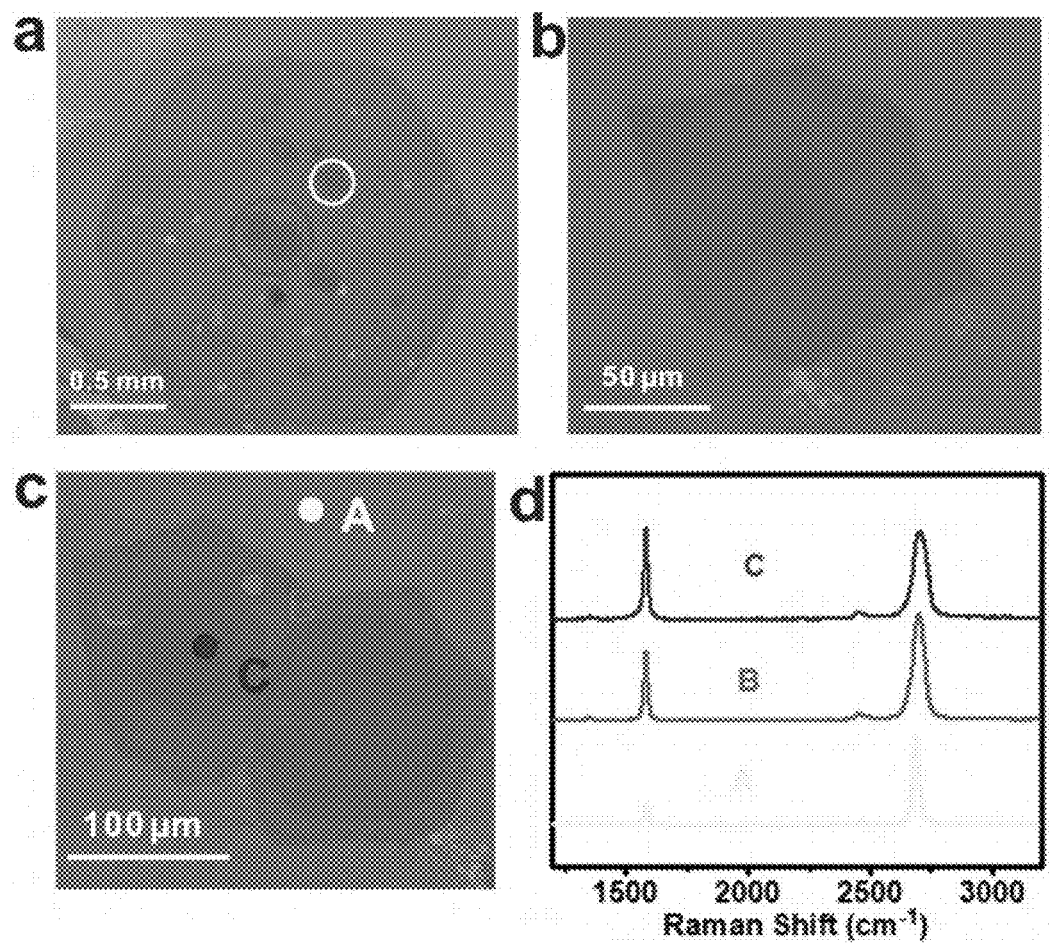
FIG. 7 shows monolayer graphene domains with several smaller second- and third-layer graphene regions.

Raman mapping provides a direct, statistically sound method to confirm the quality, thickness and uniformity of graphene samples. Therefore, Raman mapping was performed on the graphene corner shown in FIG. 6C. The step size was 0.5 μm and the investigated region was ~25 μm×25 μm. 3D Raman maps of D (1,350 $cm^{-1}$), G (1,580 $cm^{-1}$) and 2D (2,690 $cm^{-1}$) peaks were extracted and plotted in FIG. 6E, where different colors indicate different intensities ($I_x$, where x=D, G or 2D). FIG. 6E shows that $I_D$ is negligibly small over the area of the graphene, with the exception of the edges, revealing that the as-grown graphene sample was almost defect-free. The graphene edges have relatively large D peaks in the spectra and the ratio of the $I_D$ to $I_G$ peak is ~0.1, consistent with previous studies of graphene edges, suggesting the edges are dominated by zigzag terminations. FIG. 6E shows that $I_G$ and $I_{2D}$ are relatively uniform and the $I_{2D}$ is more than twice as large as $I_G$ over the graphene corner, indicating complete monolayer graphene coverage in the investigated region. Interestingly, small second- and third-layer graphene regions were occasionally observed on the large monolayer graphene domains, indicating a terraced structure (FIG. 7). Without being bound by theory, Applicants attribute the formation of this special structure to the self-limiting mechanism of graphene growth, meaning that after the coverage of carbon on the Cu surface, the next-layer graphene growth may be limited.

Figure 8:
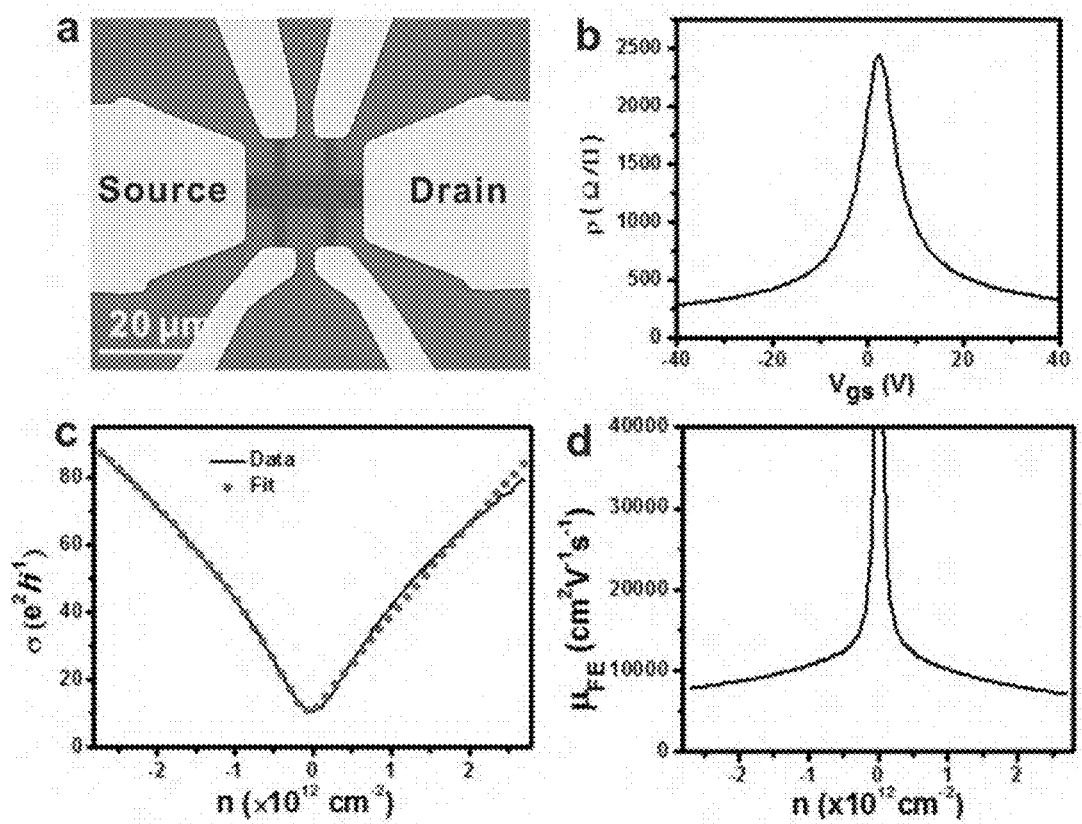
FIG. 8 shows a graphene Hall bar device with resistivity, conductivity and mobility from a FET measured at 300 K.

To evaluate the quality of single-crystal graphene domains, Hall bar FETs with a highly doped p-type silicon back gate were fabricated (see Example 1.6). FIG. 8A shows the SEM image of a fabricated Hall bar FET device. The plot of resistivity versus back gate voltage, $V_{gs}$, is shown in FIG. 8B, indicating the ON/OFF ratio is ~10. The device exhibits low resistivity (270 Ω/m) at high carrier density and a sharp resistivity peak of 2.5 kΩ/m at the Dirac point ($V_{Dirac}$=2.4 V). The conductivity σ versus carrier density n (given by n=$C_g(V_{gs}-V_{Dirac})$/e, $C_g$=11.5 $nF/cm^2$) is shown in FIG. 8C, which exhibits almost linear σ for both positive and negative carriers. To further characterize the transport characteristic of the single-crystal graphene device, a commonly used self-consistent Boltzmann theory was used that includes long- and short-range scattering sources to fit the conductivity: $\sigma^{-1}=(\mu_c ne+\sigma_0)^{-1}+\rho_s$. In this model, $\mu_c$ denotes the density-independent charge mobility corresponding to the long-range scattering; $\rho_s$ is the resistivity contributed from short-range scattering; and $\sigma_0$ is the residual conductivity at the Dirac point. From the data, fitted as shown in FIG. 8C, the density-independent charge mobility can be extracted, to give $\mu_c$=10400 $cm^2V^{-1}s^{-1}$ for positive charge carriers. The extracted density-independent mobilities for positive charge carriers, from a total of 10 tested devices, ranged from 7900 to 11000 $cm^2V^{-1}s^{-1}$. These high mobilities within a relatively narrow range indicate an electrical performance comparable to that of exfoliated graphene on a $SiO_2$ substrate. FIG. 8D is the density-dependent field effect mobility $\mu_{FE}$=σ/ne, using a simple Drude model. For positive charge carriers $\mu_{FE}$ spans from 8600 $cm^2V^{-1}s^{-1}$ at a carrier density of $2\times10^{12}$ $cm^{-2}$ to greater than 12500 $cm^2V^{-1}s^{-1}$ at a density less than $5\times10^{11}$ $cm^{-2}$. Overall, the high electrical performance of the graphene devices indicates the high quality of the as-grown single-crystal graphene. The carrier mobility is larger than those of recently reported single-crystal graphene on $Si/SiO_2$ substrates. The carrier mobility of the as-produced graphene can likely be further improved by using boron nitride substrates or by fabricating suspended devices.

Without being bound by theory, it is envisioned that the growth of graphene in this Example is restricted to the catalyst surface due to the low solubility of carbon in Cu (<0.001 atomic %). Based on the data presented here, Applicants propose a growth mechanism for Cu-based graphene (FIG. 9A) and demonstrate reaction conditions that reduce the graphene nucleation density and allow the growth of larger-size graphene domains using an extended growth period (FIGS. 9B-G, Table 1 and FIG. 10).

TABLE 1

Growth conditions of E1-E11 in the CP-CVD system. The same temperatures were used in the growth and the annealing processes for every growth condition set listed Table 1. Leaving the vacuum valve completely open in FIG. 3A, 0.15 sccm $CH_4$, 5 sccm $CH_4$, 70 sccm $H_2$ and 500 sccm $H_2$ correspond to 3.5, 90, or 950 mT and 8.4 Torr chamber pressure, respectively. In this Example, all temperatures were calibrated using a k-type thermocouple probe (Omega Engineering, Inc.)

| | Sample | | | | |
|---|---|---|---|---|---|
| | E1 | E2 | E3 | E4 | E5 |
| Temp (° C.) | 1060 | 1060 | 1060 | 1060 | 1070 |
| Growth-$CH_4$ (sccm) | 5 | 0.15 | 0.15 | 0.15 | 0.15 |
| Growth-time (min) | 1 | 15 | 70 | 80 | 110 |
| Growth-pressure (Torr) | 8.2 | 8.2 | 8.2 | 108 | 108 |

TABLE 1-continued

Growth conditions of E1-E11 in the CP-CVD system. The same temperatures were used in the growth and the annealing processes for every growth condition set listed Table 1. Leaving the vacuum valve completely open in FIG. 3A, 0.15 sccm $CH_4$, 5 sccm $CH_4$, 70 sccm $H_2$ and 500 sccm $H_2$ correspond to 3.5, 90, or 950 mT and 8.4 Torr chamber pressure, respectively. In this Example, all temperatures were calibrated using a k-type thermocouple probe (Omega Engineering, Inc.)

| | | | | | |
|---|---|---|---|---|---|
| Growth-$H_2$ (sccm) | 500 | 70 | 70 | 70 | 70 |
| Annealing-time (h) | 0.5 | 0.5 | 7 | 7 | 7 |
| Annealing-pressure (Torr) | 8.2 | 8.2 | 1500 | 1500 | 1500 |
| Annealing-$H_2$ (sccm) | 500 | 500 | 500 | 500 | 500 |
| Cu-polishing | No | No | Yes | Yes | Yes |
| Domain size (μm) | ~15 | ~30 | ~300 | ~400 | ~1000 |
| Domain shape | Square | Square | Square | Hexagon | Hexagon |

| | Sample | | | | | |
|---|---|---|---|---|---|---|
| | E6 | E7 | E8 | E9 | E10 | E11 |
| Temp (° C.) | 1075 | 1077 | 1077 | 1077 | 1077 | 1077 |
| Growth-$CH_4$ (sccm) | 0.15 | 0.15 | 0.3 | 0.3 | 0.15 | 0.15 |
| Growth-time (min) | 120 | 125 | 90 | 125 | 15 | 20 |
| Growth-pressure (Torr) | 108 | 108 | 108 | 108 | 108 | 108 |
| Growth-$H_2$ (sccm) | 70 | 70 | 150 | 200 | 70 | 70 |
| Annealing-time (h) | 7 | 7 | 7 | 7 | 7 | 7 |
| Annealing-pressure (Torr) | 1500 | 1500 | 1500 | 1500 | 8.2 | 1500 |
| Annealing-$H_2$ (sccm) | 500 | 500 | 500 | 500 | 500 | 500 |
| Cu-polishing | Yes | Yes | Yes | Yes | Yes | No |
| Domain size (mm) | ~1.8 | ~2.3 | ~0.1 | | ~0.1 | ~0.2 |
| Domain shape | Hexagon | Hexagon | Hexagon | none | Hexagon | Hexagon |

Figure 9:
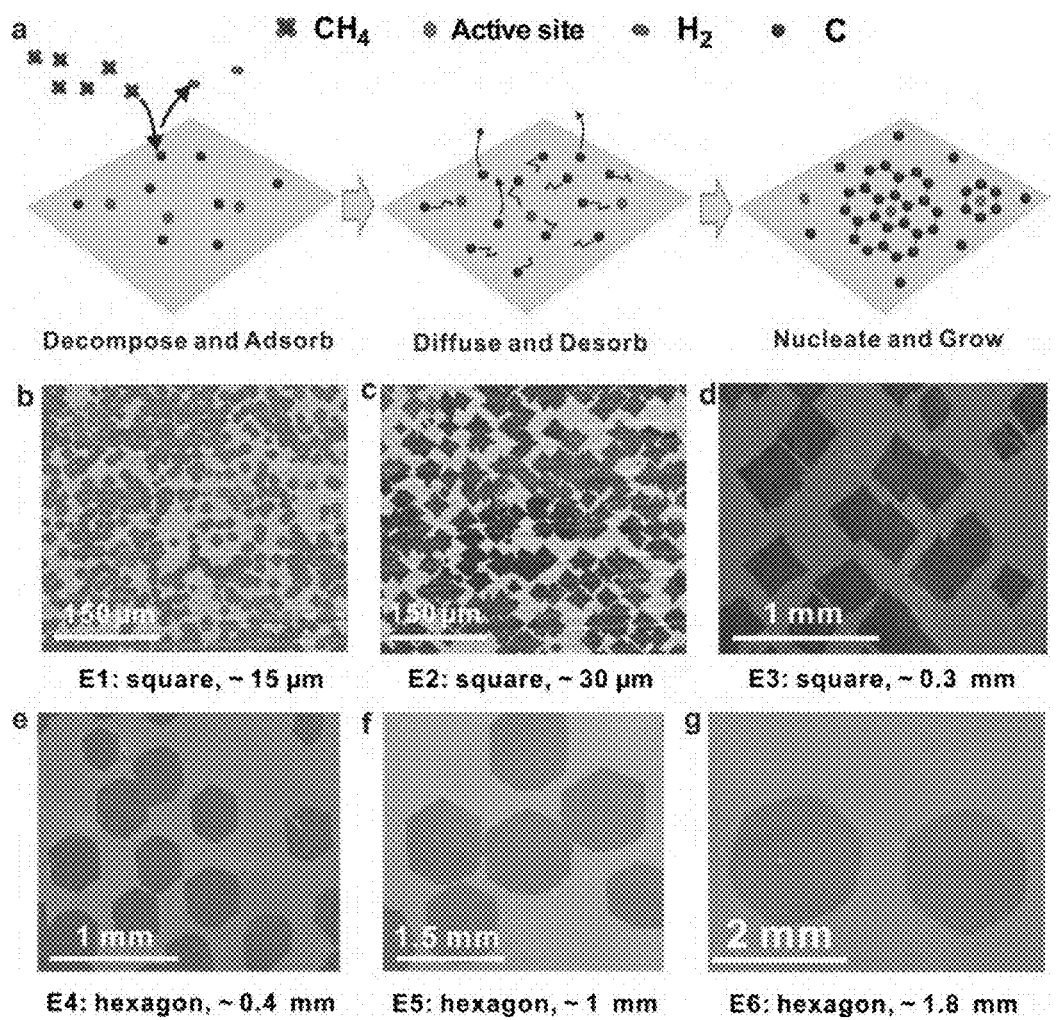
FIG. 9 shows an illustration of the Cu-based graphene growth mechanism and the influence of different parameters on the graphene domain sizes and shapes.

The overall growth processes for Cu-based graphene are described in FIG. 9A. To illustrate the process, it is divided into three main steps. Red hexagons are used to symbolize the active sites of the Cu surface, such as impurities, sharp wrinkles and defects, which are known to act as active heteronuclei in the early stages of graphene growth. (1) $CH_4$ dissociates and is chemically adsorbed on the Cu surface to form the active carbon species $(CH_{x<4})_s$, where "s" signifies "surface-adsorbed" to distinguish it from a gaseous molecule. The exact nature of the active carbon species has not been well-defined and Applicants used carbon monomers (C) to represent all types of active carbon species in FIG. 9A. (2) From recent research, the carbon-Cu interaction is weak and the desorption rate of active carbon species is comparable to its mobility on Cu surface above 870° C. Under the growth conditions described in this paper, the temperature is >1000° C., suggesting that the movement of active carbon species on the Cu surface is dominated by diffusion and desorption. (3) Theoretical calculations show that active carbon species are thermodynamically unstable and tend to agglomerate into thermodynamically stable $(C_nH_y)_s$ species on the active sites of the Cu surface, ultimately leading to the formation of graphene nuclei. Once the graphene nuclei are formed, most of the active carbon species will be captured and consumed in growth of graphene, reducing the probability that new graphene nuclei will be formed in the nearby areas of the Cu catalyst.

From the data that has been presented, reducing the concentrations of both active sites and active carbon species on the Cu surface is a key factor in reducing graphene nuclei density, enabling the growth of larger-size graphene domains during the extended growth time. Based on this mechanism, Applicants explored the influences of several parameters on the graphene domain sizes.

Figure 10:
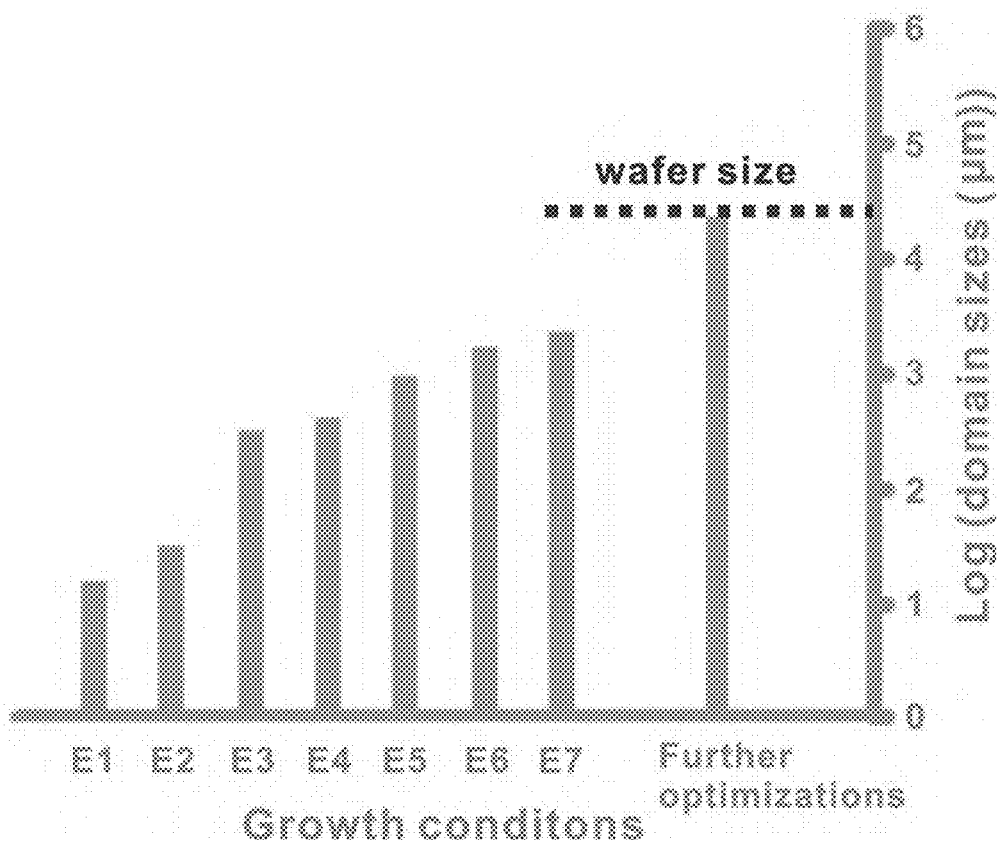
FIG. 10 depicts conditions for the synthesis of large scale single-crystal graphenes. This figure demonstrates the variation of the graphene domain size (Log scale) as a function of growth conditions. Through the series of experiments, with variables based on the proposed growth mechanism in FIG. 9A, the domain sizes of the as-produced graphene domains increased ~150 times, from ~0.015 mm (E1) to ~2.3 mm (E7), which is close to 10% of a 1-inch silicon wafer surface. Limited by the CVD system, further optimizations were not done.
Figure 11:
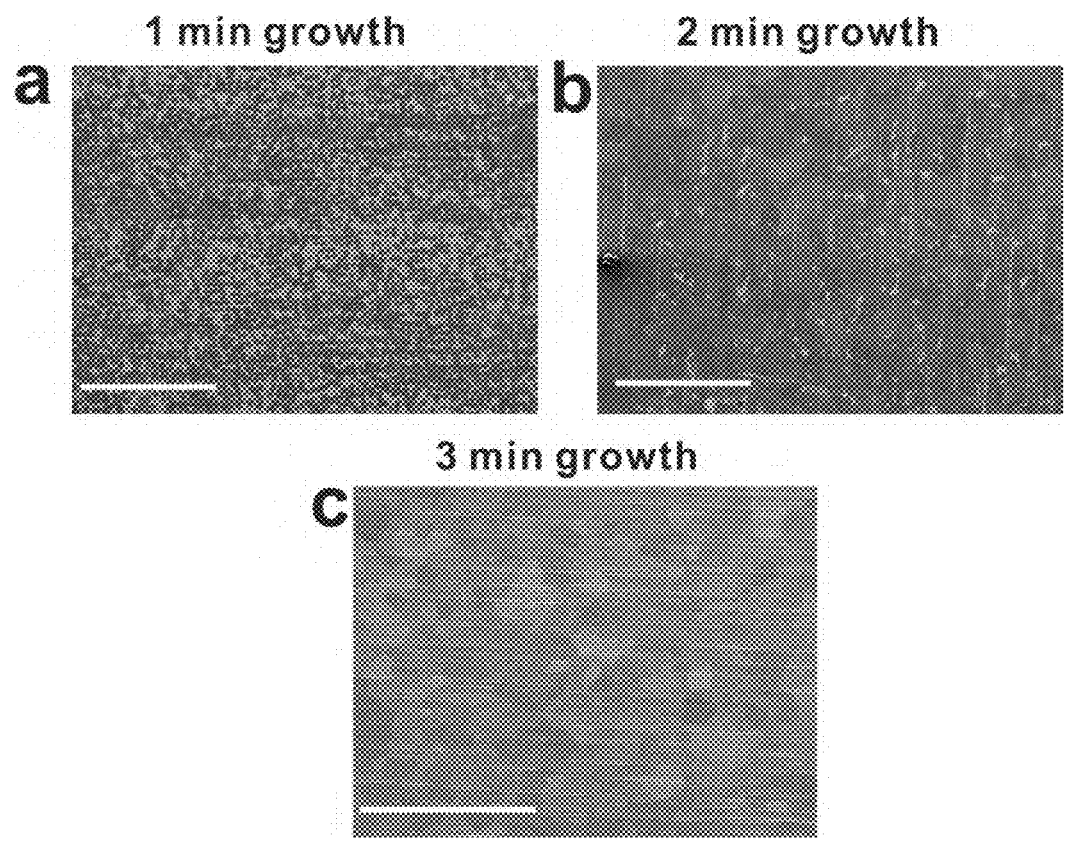
FIG. 11 shows SEM images of as-grown graphene using the same conditions as E1 with the exception of the growth time.
Figure 12:
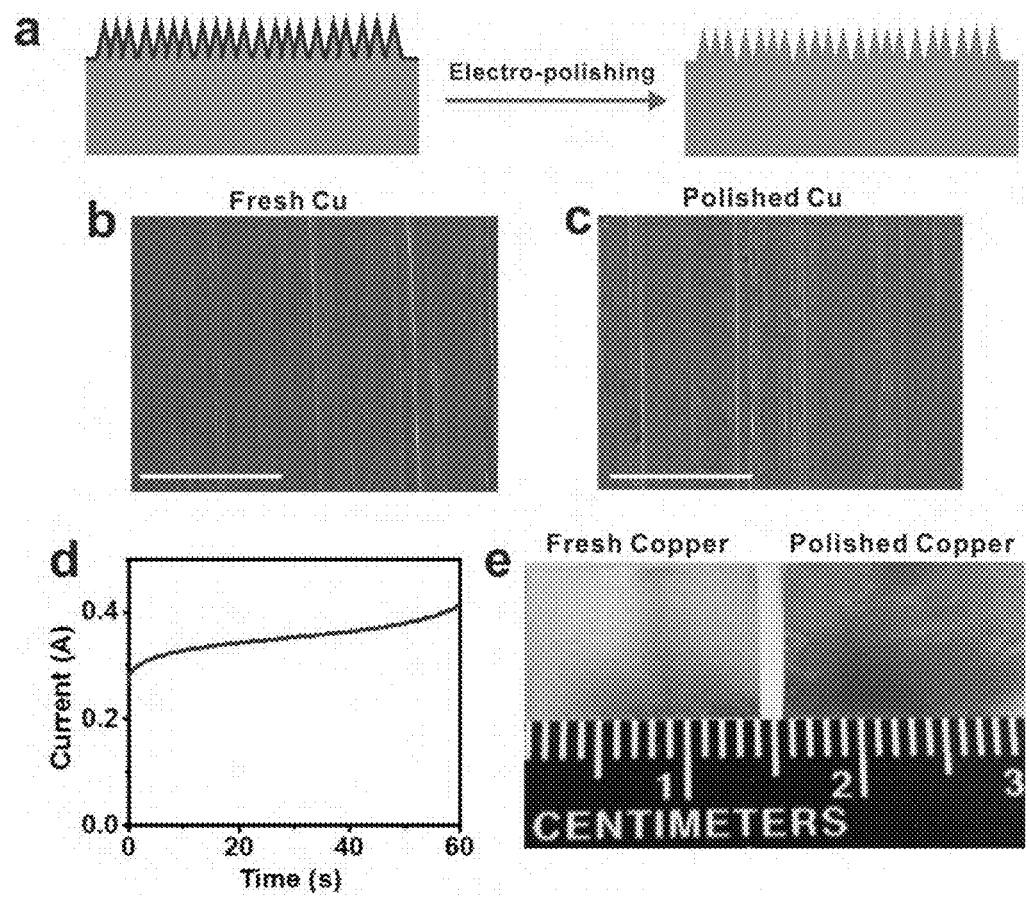
FIG. 12 shows Cu-surface cleaning through the electrochemical-polishing method.
Figure 13:
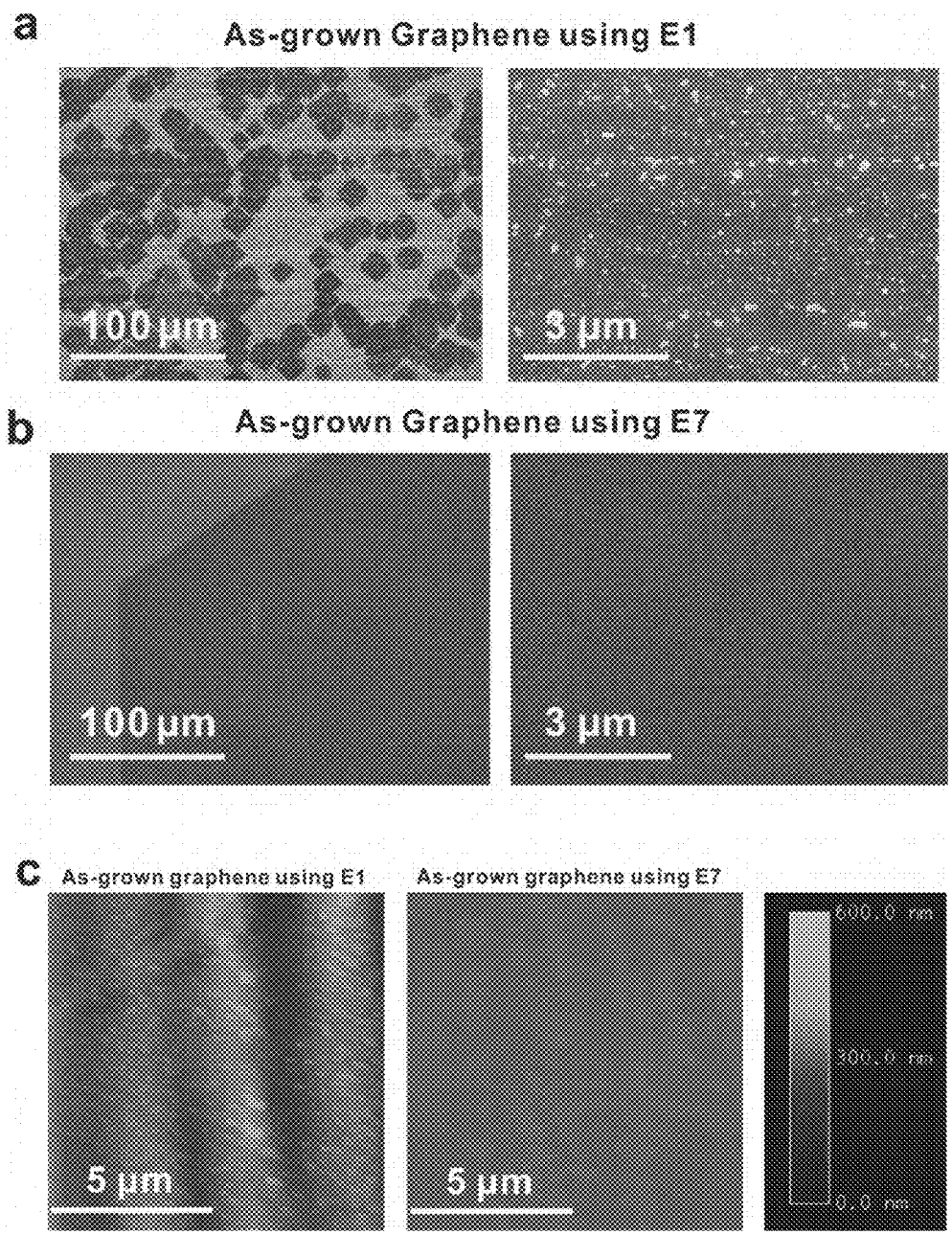
FIG. 13 shows SEM and atomic force microscopy (AFM) images of graphene synthesized using E1 and E7 conditions.

11 growth experiments (E1-E11) were performed. The experiments are listed in Table 1. For every experiment, the same temperatures were used in the annealing and growth processes. The relationship between graphene domain sizes and growth conditions are plotted in FIG. 10. In the following experiments, Applicants stopped the graphene growth before a continuous film formed in order to directly demonstrate the shapes and sizes of as-grown graphene domains under different growth conditions. Applicants began the experimental series with E1, which is the CVD-based graphene growth condition that was generally used in the laboratory. Under the conditions of E1, the obtained graphene domains were square and the domain sizes were ~15 μm (FIG. 9B and FIG. 11). In E2, the $CH_4$ flow rate was lowered to 0.15 sccm and the flow rate ratio of $H_2$ to $CH_4$ was increased to ~460. Both contributed to diluting the concentration of active carbon species on the Cu surface. In this case, the graphene domain sizes increase to ~30 μm after extended periods of time (FIG. 9C). From E3 to E10, electrochemical polishing and the high pressure annealing were used to improve the quality of the Cu. Electrochemical polishing cleans the Cu surface and removes the impurity layer (FIG. 12); high-pressure annealing can eliminate sharp wrinkles, steps and defects to improve the quality of the Cu (FIG. 13). Both apparently reduced the Cu surface active sites and consequently decreased the graphene nucleus density. FIG. 10D shows that the graphene domains size increased to ~0.3 mm on the electrochemical-polished and high-pressure annealed Cu substrates (E3) when other conditions are similar with E2. In this case, the graphene domain shapes are still square.

The graphene domain shapes become hexagonal when adjusting the chamber pressure to ~108 Torr during the growth process (E4-E11 and FIGS. 9E-G). The shape evolution is attributed to the fact that $H_2$ has different etching abilities on zigzag and armchair terminations at different $H_2$ partial pressures and temperatures.

Graphene domain sizes further increased when raising annealing and growth temperatures (E5-E7, FIG. 3B, FIG. 4, FIGS. 9E-G). FIGS. 9E-G show that the sizes of the graphene domains increased from ~0.4 mm to ~1 mm and ~1.8 mm as the temperature increased from 1060° C. (E4, FIG.

9E) to 1070° C. (E5, FIG. 9F) and 1075° C. (E6, FIG. 9G). Without being bound by theory, it is envisioned that the higher growth temperature reduces the concentration of active carbon species on the Cu surface by speeding desorption and the higher annealing temperature improves the quality of Cu substrates. It is envisioned that both of these contributed to the reduction of the graphene nucleation density and consequently the increase of the graphene domain sizes in the extended growth time. A temperature of 1077° C. (E7 FIG. 3B, FIG. 4) is the limit of the CP-CVD system and in this case the graphene domain sizes increased to ~2.3 mm. Moreover, graphene synthesized using the conditions of E7 has a cleaner and flatter surface than those of graphene obtained using E1 (FIG. 13), suggesting its improved quality.

Figure 14:
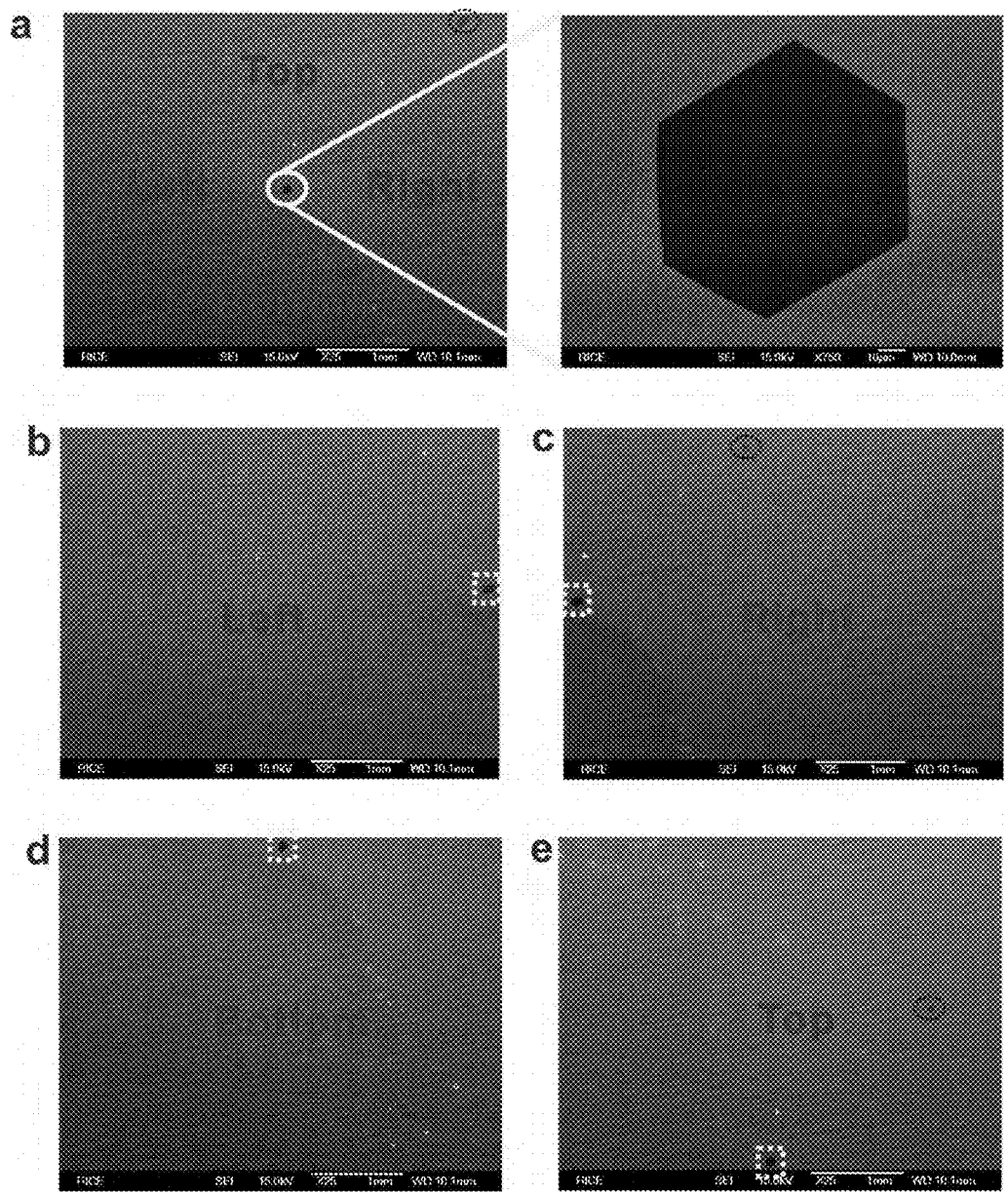
FIG. 14 shows SEM images indicating that only one graphene seed was produced in ~1 cm×1 cm Cu when using E8 conditions.
Figure 15:
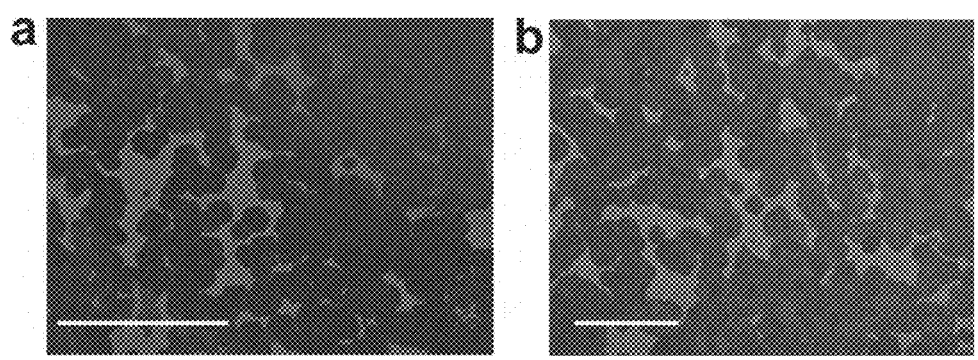
FIG. 15 shows SEM images of graphene synthesized using E10 and E11 conditions.
Figure 16:
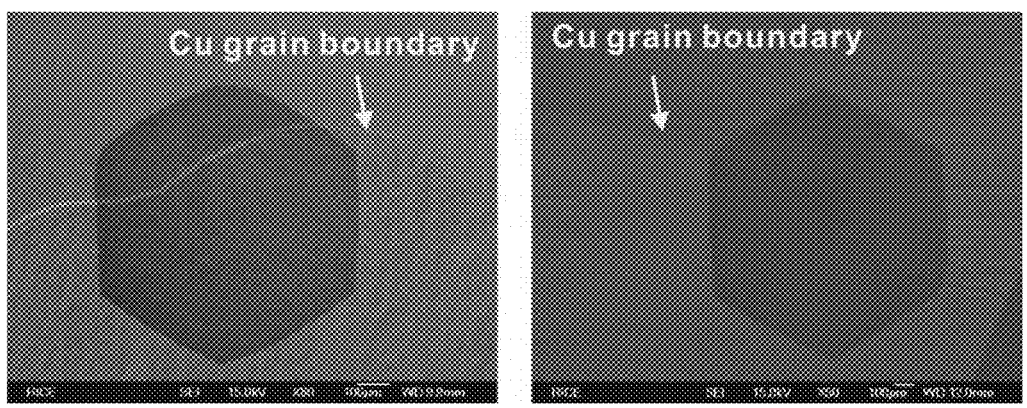
FIG. 16 shows SEM images of graphene domains over Cu grain boundaries. The growth condition is E5. The scale bar in the two SEM images is 100 µm.
Figure 17:
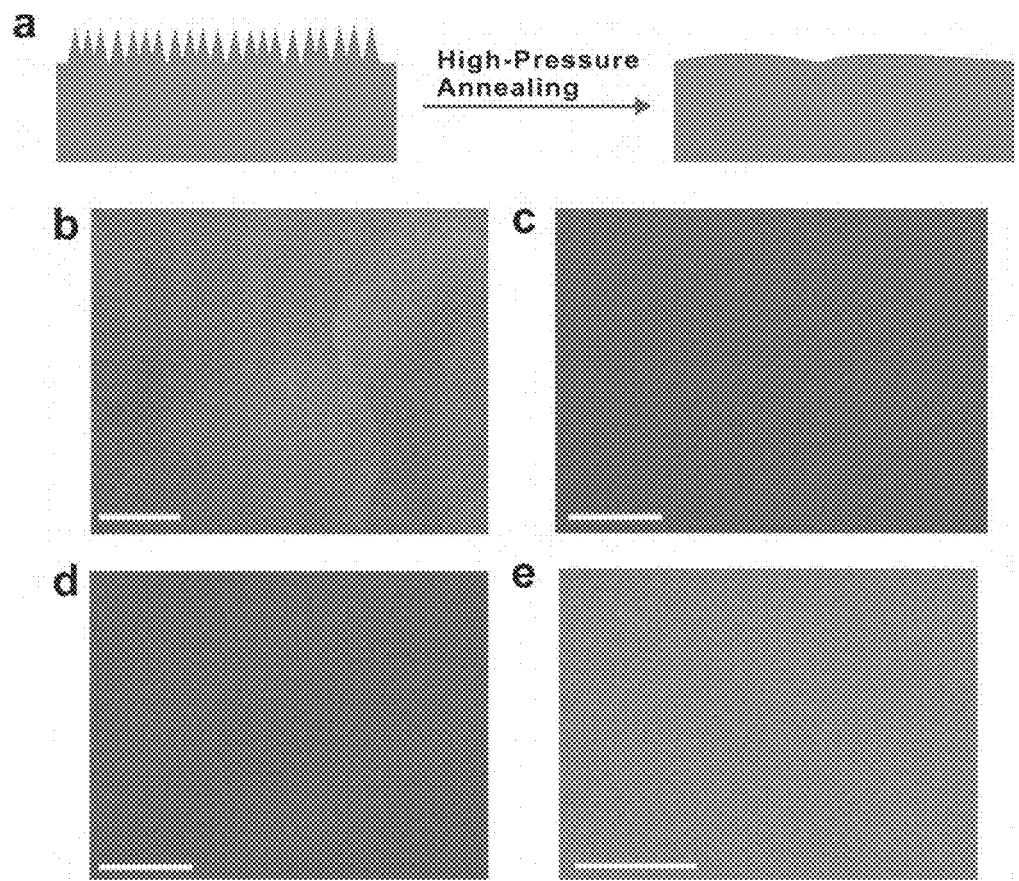
FIG. 17 shows schemes and images relating to high-pressure annealing of Cu.

When the flow rate of $H_2$ was increased to 150 sccm from 70 sccm to dilute $CH_4$ (E8), only one graphene nucleus was found on ~1 cm×1 cm Cu after 90 min growth (FIG. 14). Moreover, no graphene nucleus was found on ~1 cm×1 cm Cu after 125 min growth when further increasing the flow rate of $H_2$ to 200 sccm (E9). Meanwhile, the slow edge-to-edge growth speed of the graphene domain (~1 $\mu m \cdot min^{-1}$) under E8 also placed an obstacle for the final synthesis of centimeter-size single-crystal graphene. Moreover, if this process could be conducted in a cleanroom to minimize exogenous carbon impurities on the foil, then even larger domains would be expected. However, these two experiments (E8-E9) indicate the possibility of one-seed requirement on the wafer-scale Cu through the further optimizations of growth conditions. In addition, the control experiments (E10-E11) in FIG. 15 demonstrate that the combination of Cu-surface electrochemical-polishing and high-pressure annealing is desirable for the synthesis of high-quality and large-size single-crystal graphene. FIG. 16 demonstrates that graphene domains can grow across Cu grain boundaries, suggesting the weak influence of Cu grain size on graphene growth.

In summary, Applicants have reported in this Example the practical and feasible synthesis of large-size (~4.5 $mm^2$) single-crystal monolayer graphene using a CP-CVD method on commercial Cu foils. The as-produced graphene samples are clean, flat and hexagonal-shaped. TEM, SEM and Raman spectroscopy were used to characterize the obtained graphene, suggesting that their high quality is comparable to that of exfoliated graphene. Hall bar FETs were fabricated using the as-grown graphene, showing a mobility of positive charge carriers of ~11,000 $cm^2V^{-1} s^{-1}$ on a $SiO_2$/Si substrate at room temperature. In addition, the Cu graphene growth mechanism was explored and optimization resulted in the increase of graphene domain from ~15 $\mu m$ to ~2.3 mm, reaching ~10% of a 1-inch silicon wafer size. Moreover, in the optimized growth conditions, one graphene seed-requirement was achieved on the centimeter-size Cu foils.

EXAMPLE 1.1

Methods

SAED and HRTEM were done using a JEOL 2100-F operated at 200 KeV. SEM was done using a JEOL6500 scanning electron microscope at 15 KeV. The Raman spectra were recorded with a Renishaw Raman RE01 scope using a 514 nm excitation argon laser. A 6 probe station (Model FWPX, Desert Cryogenics-LakeShore) was used to measure the electrical properties under vacuum ($10^{-5}$-$10^{-6}$ Torr). An Agilent 4155C semiconductor parameter analyzer was used to record the I-V data.

EXAMPLE 1.2

Graphene Synthesis

Large-size (~2.3 mm) single-crystal graphene domains were fabricated by the CP-CVD system using research grade $CH_4$ (99.999% purity, Matheson) as the carbon feedstock and ultrahigh purity $H_2$ (99.999%, Matheson) as the reduction gas. Applicants have observed that such high purity gases are desirable for the effective growth of single-crystal graphenes.

A standard 1-inch quartz tube in a CVD furnace was used as the reaction chamber. A vacuum valve (KF-25, Kurt J. Lesker) and a metering valve (SS-4BMG, Swagelok) were used to control the chamber pressure. Temperatures were calibrated using a k-type thermocouple probe (Omega Engineering, Inc.). The typical synthesis process was as follows. A 25-$\mu m$-thick 10 cm×10 cm Cu foil (99.8% purity, Alfa Aesar) was polished using the electrochemical method[1-2] and then was sonicated in 100 mL acetone (ACS spectrophotometric grade, ≥99.5%, Sigma-Aldrich) for 60 min using an ultrasonic cleaner (FS 110H, Fisher Scientific). The Cu foil was thoroughly washed using 100 mL methanol (3×) and 100 mL DI water (3×) and then dried by a nitrogen flow for 5 min. The cleaned Cu foil was cut into ~1 cm×1 cm small pieces and loaded into the CP-CVD system and the reaction chamber was evacuated to ~1 mT by completely opening the vacuum valve. The temperature was increased to 1077° C. and then 500 sccm of $H_2$ was introduced into the system for 5 min. After this, the vacuum valve was turned off and the chamber pressure was adjusted to 1500 Torr by the metering valve and then the Cu foil was moved into the hot region of the furnace by a magnetic rod and annealed for 7 h. After annealing, the flow rate of $H_2$ was decreased to 70 sccm and the chamber pressure was adjusted to ~108 Torr by the metering valve; 0.15 sccm of $CH_4$ was then introduced into the reaction chamber for 125 min. After the growth, the $CH_4$ flow was turned off and the Cu foil was quickly removed from the hot region using a magnetic rod and permitted to cool to the room temperature.

EXAMPLE 1.3

Cu Electrochemical Polishing

The electrochemical polishing solution consisted of 100 mL of water, 50 mL of orthophosphoric acid, 50 mL of ethanol, 10 mL of isopropyl alcohol, and 1 g of urea. A 25 $\mu m$-thick 10 cm×10 cm Cu foil (99.8%, Alfa-Aesar) was immersed in the electrochemical-polishing solution and used as the anode while a 25 $\mu m$-thick 20 cm×20 cm Cu foil (99.8%, Alfa-Aesar) was used as the cathode. A CHI electrochemical workstation was used to supply the constant voltage/current. The applied voltage was 4.8 V and the electrochemical polishing time was 60 s. After electrochemical polishing, the Cu foil was rinsed with 50 mL deionized (DI) water (3×), further washed with 50 mL ethanol (3×), and then dried with a nitrogen flow for 5 min.

EXAMPLE 1.4

Graphene Transfer to $SiO_2$/Si Wafers

The graphene transfer protocol used was as follows: (1) 200 $\mu L$ PMMA (MicroChem Corp. 950 PMMA A4, 4% in anisole) solution was spin-coated onto the graphene/Cu foil at 1000 rpm for 40 s, followed by curing the sample on a hot plate at 120° C. for 1 min; (2) the Cu foil was etched with 0.1 M aqueous $(NH_4)_2S_2O_8$ overnight, resulting in the PMMA/graphene film being lifted from the surface of the Cu and floating to the top of the etchant solution; (3) submerging a clean glass slide into the etchant and picking up the floating film to transfer it into DI water for 10 min to wash away remaining etchants (done 3×); (4) dipping a $SiO_2$/Si wafer into water and picking up the film; (5) leaving the PMMA/graphene/$SiO_2$/Si overnight in the air, and then heating the sample for 15 min at 180° C. using the hot plate followed by vacuum drying at 70° C. for 2 h; (6) placing the sample into acetone at 55° C. for 2 h to dissolve the PMMA layer; (7) drying the sample using a nitrogen flow for 5 min.

EXAMPLE 1.5

Graphene Transfer to TEM Grids

The graphene transfer protocol was as follows: (1) 200 μL PMMA (MicroChem Corp. 950 PMMA A4, 4% in anisole) solution was spin-coated onto the graphene/Cu foil at 3000 rpm for 40 s, followed by curing the sample on a hot plate at 180° C. for 1 min; (2) etching the Cu foil with 0.05 M aqueous $(NH_4)_2S_2O_8$ overnight, resulting in the lift-off of the PMMA/graphene film; (3) submerging a clean glass slide into the etchant and picking up the floating film to transfer it into DI water for 10 min to wash away remaining etchants (done 3×); (4) dipping a TEM grid (Lacey Formvar/Carbon, 300 mesh, Ted Pella Inc.) into the DI water and picking up the film; (5) vacuum drying the film on the grid at 70° C. for 2 h to remove water; (6) carefully dipping the grid into acetone to dissolve the PMMA layer; (7) vacuum drying the grid at 70° C. for 2 h to remove remaining acetone. Interestingly, the single-crystal graphene domains easily folded during the transfer process due to the lack of supporting ridge grain boundaries. This makes the transfer more difficult than with grain-containing graphene.

EXAMPLE 1.6

Electric Devices Fabrication and Measurement

After transfer to a highly doped silicon substrate with a 300 nm-thick thermal oxide, the graphene samples were patterned to produce a Hall bar structure, with a channel length of 10 μm and width of 5 μm between the center of the voltage probes, by electron beam lithography (EBL) followed by oxygen plasma etching. Next, another EBL step was used to define the electrode leads, followed by the electron beam evaporation of Ti/Au (2 nm/60 nm) and lift-off. The electrical measurements were conducted under a pressure of $10^{-5}$-$10^{-6}$ Torr in a six-arm probe station (Model FWPX, Desert Cryogenics-LakeShore) using an Agilent 4155C semiconductor parameter analyzer to measure the electronic characteristics of the devices.

The embodiments described herein are to be construed as illustrative and not as constraining the remainder of the disclosure in any way whatsoever. While the embodiments have been shown and described, many variations and modifications thereof can be made by one skilled in the art without departing from the spirit and teachings of the invention. Accordingly, the scope of protection is not limited by the description set out above, but is only limited by the claims, including all equivalents of the subject matter of the claims. The disclosures of all patents, patent applications and publications cited herein are hereby incorporated herein by reference, to the extent that they provide procedural or other details consistent with and supplementary to those set forth herein.

EXAMPLE 2

Large Hexagonal Bi- and Trilayer Graphene Single Crystals with Varied Interlayer Rotations Recent advancements in CVD techniques have enabled the fabrication of large-size and high-quality single-crystal monolayer graphene. However, monolayer graphene has zero band gap, limiting its potential applications. In contrast, bi- and tri-layer graphene have rich electronic and optical properties that are dependent on their interlayer stacking orders, opening broad applications in nanoelectronics and optics. Therefore, CVD synthesis of large bi- and trilayer graphene single crystals with well-defined interlayer stacking that can be isolated from their growing substrates would provide a material with both fundamental interests and practical applications.

In this Example, Applicants report the synthesis of ~100 μm bi- and trilayer single-crystal graphene domains with hexagonal shapes on pretreated Cu foils. The as-made graphene domains can be isolated from the Cu surfaces and transferred onto silica wafers or trench-patterned silica wafers to suspend them without introducing damages or folds. This process has great potential for studying the stacking-dependent electronics and optics in these graphene domains. Moreover, Applicants found that the as-produced graphene domains show almost exclusively either 0° or 30° interlayer rotations. Raman spectroscopy, transmission electron microscopy (TEM) and Fourier transformed infrared spectroscopy (FT-IR) with synchrotron radiation were used to demonstrate that bilayer graphene domains with 0° interlayer stacking angles were Bernal stacked. Since the 0° Bernal stacking is known to dominate in graphite, the 30° interlayer rotation is anomalous because it has a high stacking energy. Applicants propose a theory on the growth mechanism of few-layer graphene that is supported by first-principle calculations, and that explains the origin of the interlayer rotations and agrees well with the experimental observations.

The fabrication of single-crystal hexagonal bi- and trilayer graphene domains was achieved in one batch on electrochemically polished and high-pressure annealed Cu foils via a double-annealing process (FIG. 18A). The detailed growth procedures are described in the sections herein. After growth, graphene domains were transferred onto $SiO_2$ (100 nm)/Si substrates via a PMMA-assisted transfer method for optical characterizations, which permit the direct visualization of shapes and thicknesses of the as-produced graphene domains. FIGS. 18B-G and FIG. 19 provide representative optical images of as-produced graphene domains transferred onto $SiO_2$/Si wafers. From these optical images, Applicants can see that individual single-crystal graphene domains could be completely isolated from growing substrates and transferred onto silica wafers without inducing any damages or folds, indicating great potential for studying their stacking-order dependent electronic and optical properties. It is also apparent that, in the same graphene domains, mono-, bi- or trilayer regions show hexagonal shapes and could be differentiated under optical microscopy, with lateral distances of monolayer hexagons at ~100 μm. In the same graphene domain, mono-, bi- or trilayer hexagons show decreased lateral sizes and share almost the same hexagonal center, meaning they nucleated from the same active sites at different times or at different growth rates. Additionally, according to recent research, the secondary graphene layer should nucleate and grow underneath the first graphene layer.

Figure 18:
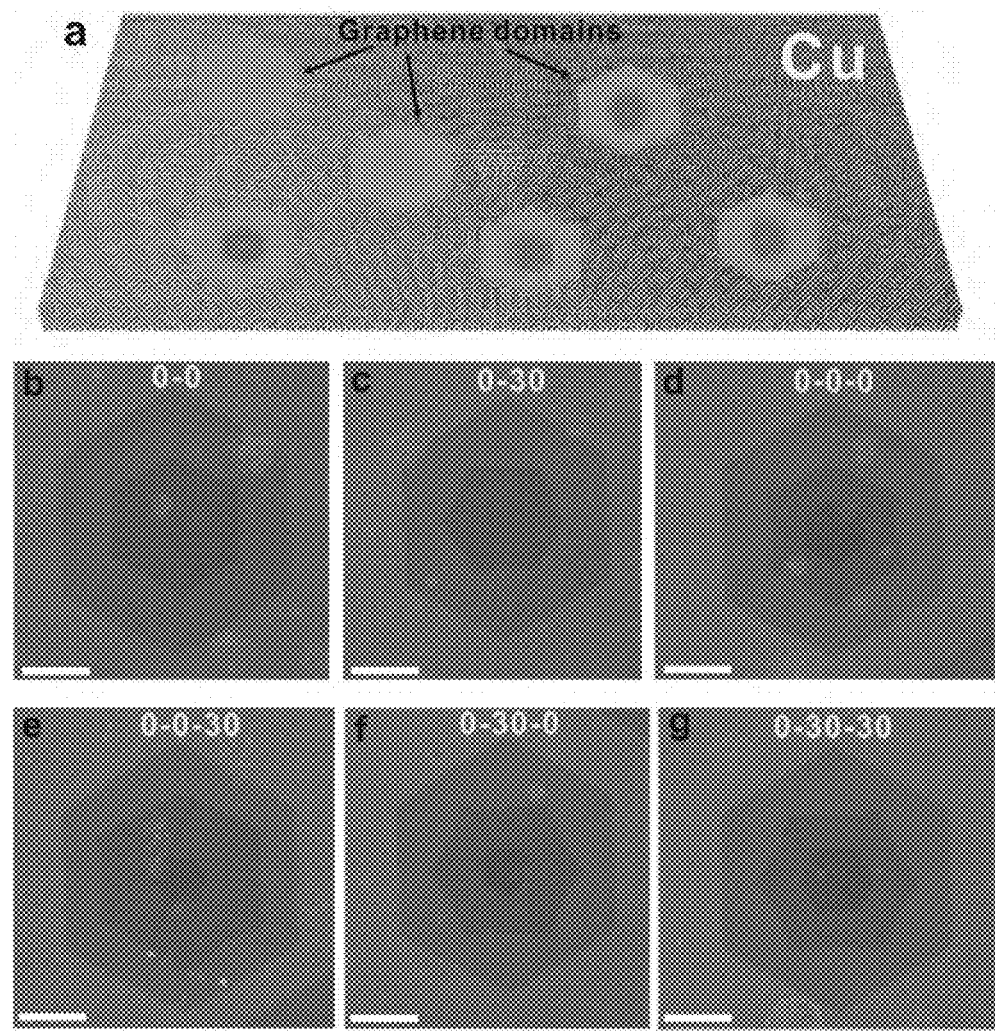
FIG. 18 provides schemes and images relating to the synthesis of multi-layer single-crystal graphene domains.
Figure 19:
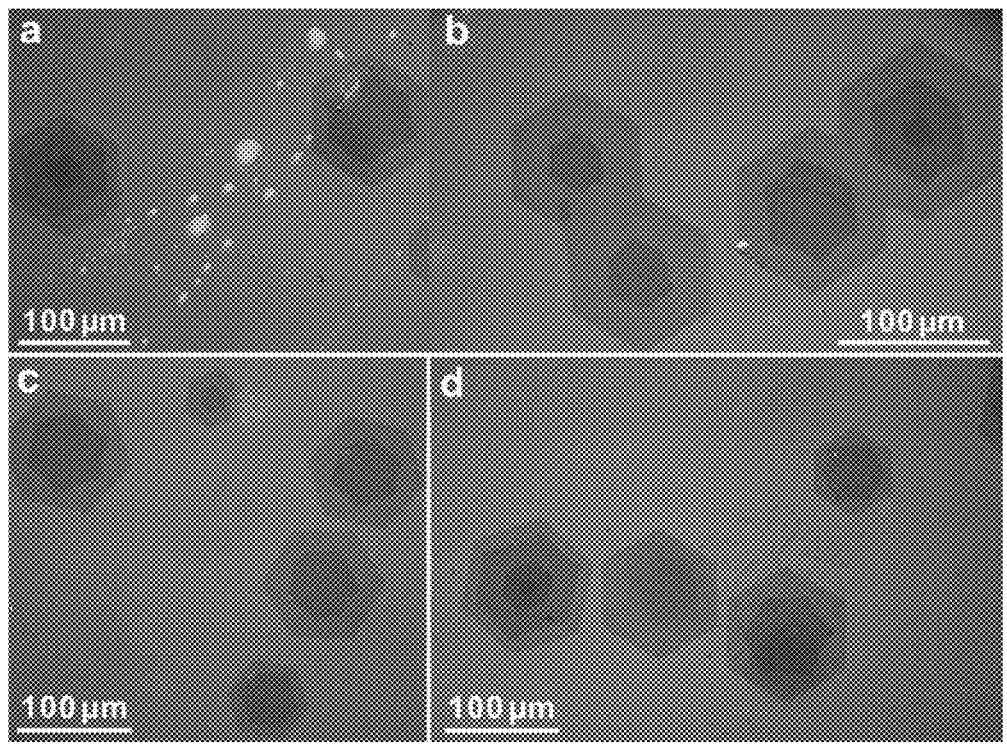
FIG. 19 shows typical optical images of as-produced graphene domains transferred onto $SiO_2$ (100 nm)/Si wafers, showing preferred 0° and 30° interlayer stacking orientations.

In contrast to graphite where Bernal stacking dominates, the as-produced few-layer graphene single crystals on the pretreated Cu demonstrated both 0° and 30° rotation preference (FIGS. 18-19). In this research, 90 few-layer graphene domains were investigated, with ~48% of 0° interlayer stacking, ~46% of 30° interlayer stacking and only ~6% of randomly twisted stacking. Two types of bilayer graphene domains and four types of trilayer graphene domains were synthesized in this research, according to their different interlayer stacking orders. Assuming orientation angles of monolayer hexagons in all graphene domains are 0° and, depending on different interlayer stacking orders, the as-made bi- and trilayer graphene domains are named as follows: 0-0 bilayer, 0-30 bilayer, 0-0-0 trilayer, 0-0-30, 0-30-0 and 0-30-30 (FIGS. 18B-G, respectively). FIGS. 18B-G also demonstrate that all six types of well-defined graphene domains could be isolated from the growing substrates and transferred onto silica wafers, indicating the ability to study their stacking-order-dependent electronic and optical properties.

In the same growth batch, through the investigation of 115 graphene domains, ~50% are bilayer domains, ~30% are trilayer domains and ~20% are monolayer and tetralayer domains, with domain sizes of monolayer hexagons ranging from ~70 μm to ~130 μm. All of the different graphene domains can be transferred onto the same target substrate, such as a silica wafer, for further optical and electronic investigations.

Figure 21:
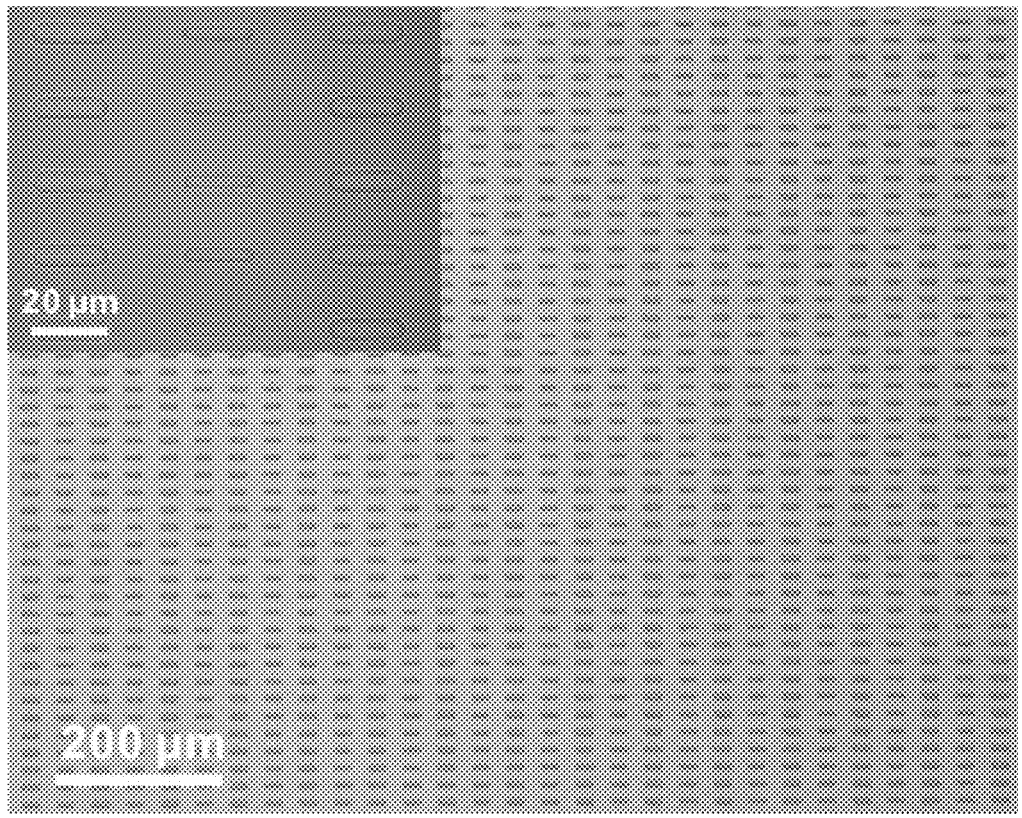
FIG. 21 shows typical optical images of well-aligned trenches on $SiO_2$ (300 nm)/Si wafers, demonstrating that two types of trenches, ~3 µm width and ~5 µm width, were made. The lengths of the trenches were ~20 µm, heights were ~250 nm, which were characterized by AFM and provided in FIG. 22.
Figure 22:
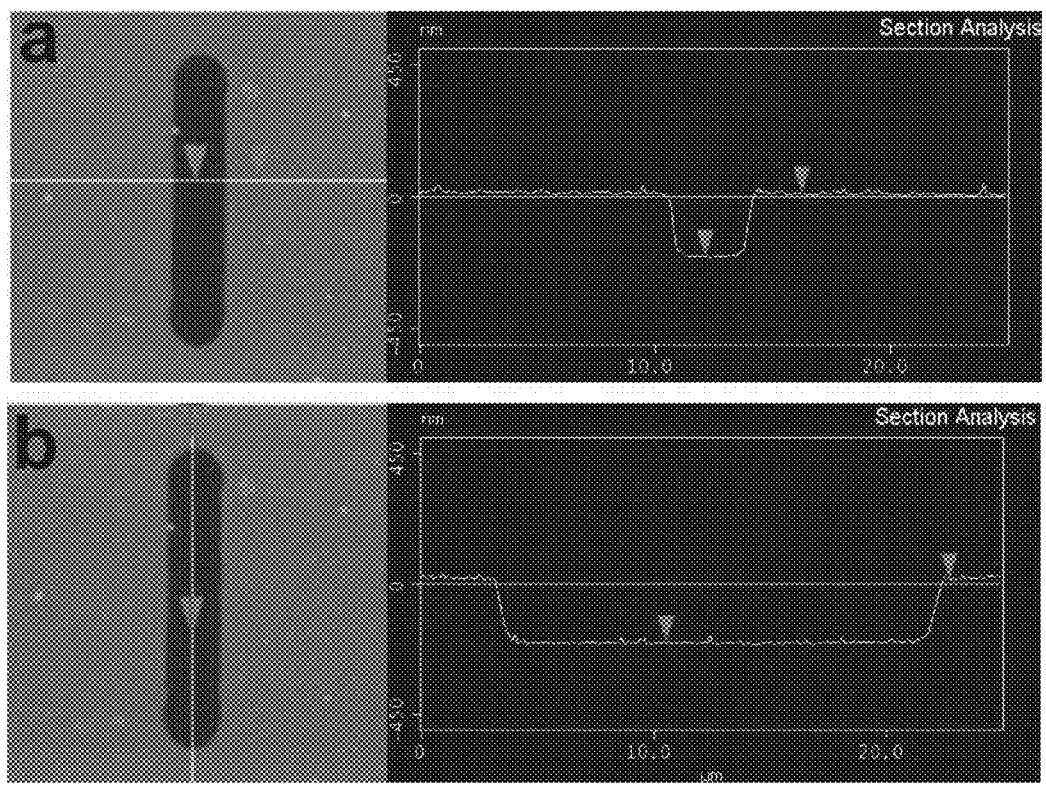
FIG. 22 shows typical AFM images and height profiles of one trench on $SiO_2$ (300 nm)/Si substrates, showing the length was ~20 µm, the width was ~3 µm and the height was ~250 nm.
Figure 23:
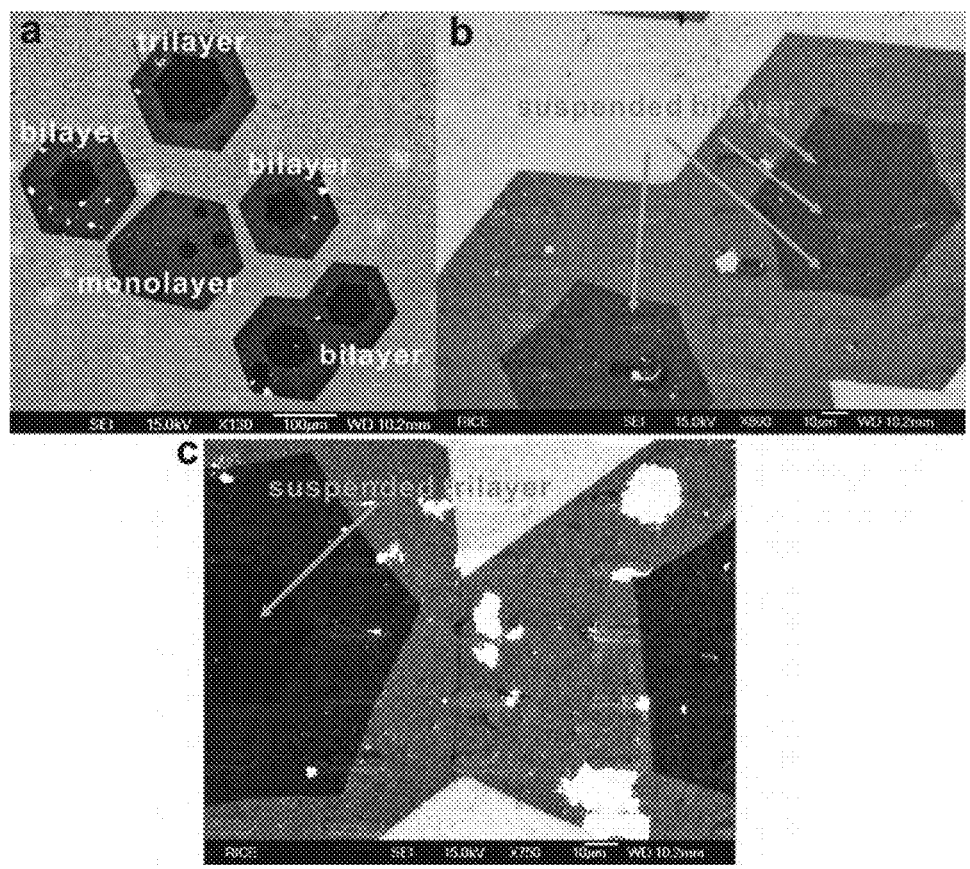
FIG. 23 shows typical SEM images of bi- and trilayer graphene domains transferred onto trench-patterned $SiO_2$ (300 nm)/Si wafers.

To investigate stacking-order dependent ballistic transport behaviors or thermal conduction of graphene domains, they need to be suspended over holes or trenches. In this Example, Applicants made well-aligned trench patterns on $SiO_2$ (300 nm)/Si wafers (see subsections herein for details), with the width at ~3 μm or ~5 μm, the length at ~20 μm and the depth at ~250 nm (FIGS. 21-22), and then transferred the as-produced graphene domains onto these trench-patterned silica wafers using a PMMA-assisted transfer method. FIG. 23 demonstrates that both bi- and trilayer graphene hexagons could be free-standing over trenches, indicating the potential of studying their stacking-order dependent ballistic transport behaviors and thermal conduction in the future.

Figure 20:
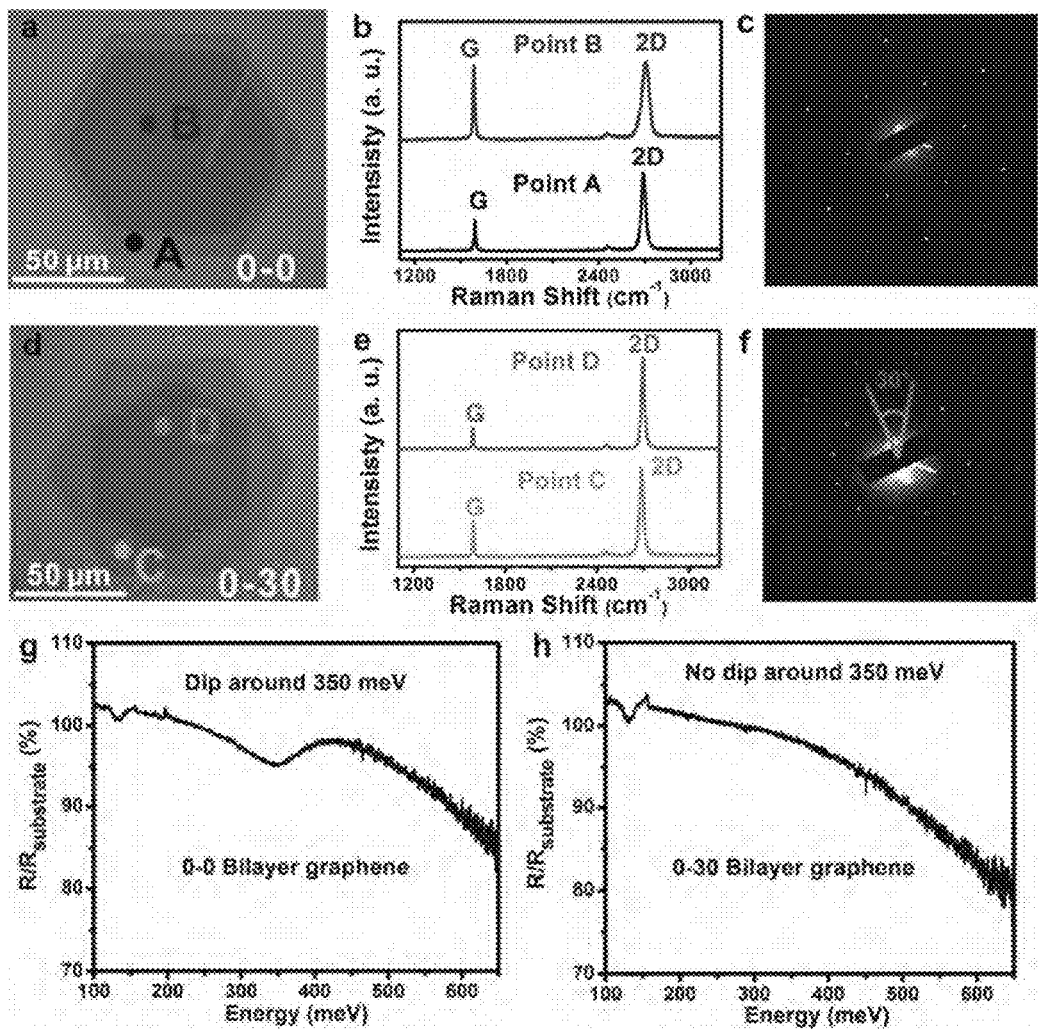
FIG. 20 shows images and characterizations of various bilayer graphene domains.
Figure 24:
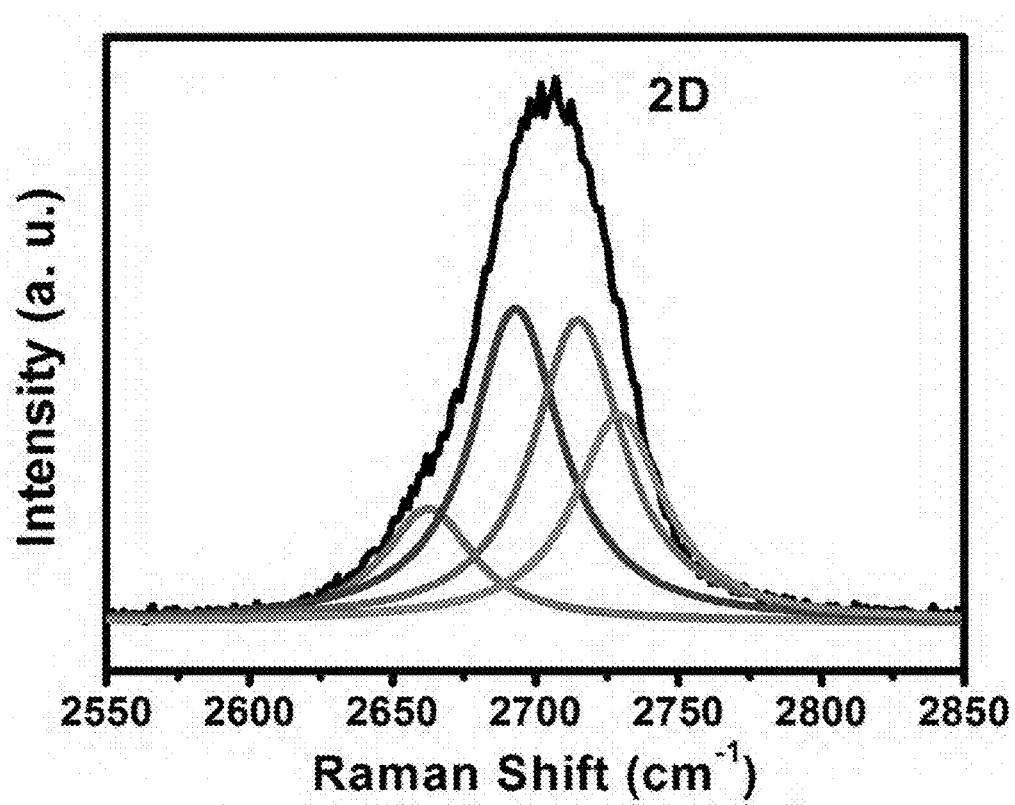
FIG. 24 shows the typical 2D peak recorded from the bilayer region of 0-0 bilayer graphene domains. The FWHM of the 2D peak is ~50 $cm^{-1}$. The 2D peak displays an asymmetric line shape and can be well-fitted by four components, individually with FWHM of ~30 $cm^{-1}$. These data indicate that the 0-0 bilayer graphene domain is Bernal-stacked.
Figure 25:
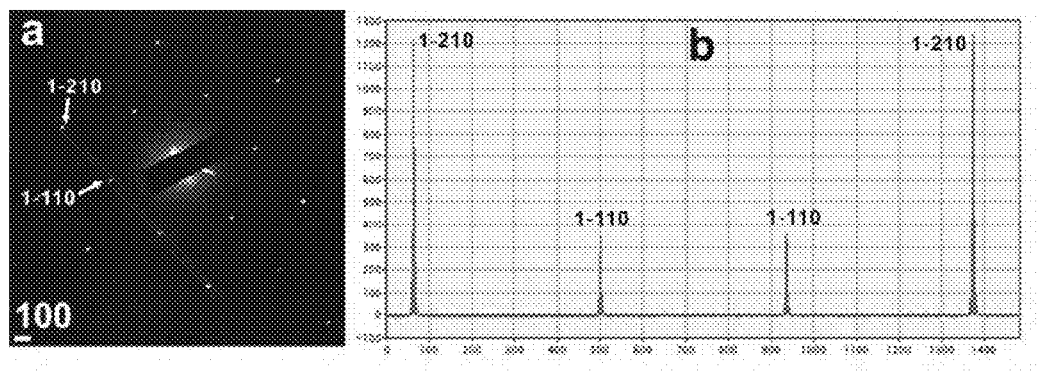
FIG. 25 shows data relating to the characterization of bilayer single-crystal graphenes.

Applicants investigated two types of bilayer graphene domains, 0-0 bilayer and 0-30 bilayer, using Raman spectroscopy, TEM and FT-IR with synchrotron radiation (FIG. 20). FIG. 20A is a typical optical image of 0-0 bilayer graphene domains, showing concentric mono- and bilayer hexagons with 0° interlayer stacking orientation. Raman spectroscopy, a powerful tool to determine thickness and quality of graphene, was first used to investigate this graphene domain. More than ten points were characterized by Raman spectroscopy on this 0-0 bilayer graphene domain, and the typical data of the monolayer region (point A) and the bilayer region (point B) are shown in FIG. 18B. FIG. 18B demonstrates that point A has the typical Raman spectrum of monolayer graphene, with an intensity ratio of G to 2D less than 0.5 and the full-width at half-maximum (fwhm) of the 2D peak at ~30 $cm^{-1}$. In contrast, the Raman spectrum of point B has an intensity ratio of G to 2D of ~1 and a fwhm of the 2D peak of ~50 $cm^{-1}$. Furthermore, the 2D peak (FIG. 24) displays an asymmetric line shape and can be well-fitted by four components, each with fwhm of ~30 $cm^{-1}$. These data indicate that the 0-0 bilayer graphene domain is Bernal-stacked. Meanwhile, no obvious D peaks were detected in either the mono- or bilayer regions of 0-0 bilayer graphene domains, indicating the presence of few $sp^3$ carbon atoms or defects. Selected area electron diffraction (SAED) patterns corroborate the stacking order in 0-0 bilayer graphene domains. FIG. 20C shows only one set of SAED patterns in the bilayer region of 0-0 bilayer graphene domains. As shown in FIG. 25, the (1-210) intensity was ~3 times stronger than the (1-100), further demonstrating the Bernal stacked order of 0-0 bilayer graphene domains.

FIG. 20D is a typical optical image of 0-30 bilayer graphene domains, showing concentric mono- and bilayer hexagons with 30° stacking orientation. The Raman spectra in FIG. 20E show that both the monolayer region (point C) and the bilayer region (point D) demonstrate typical Raman spectrum of monolayer graphene, meaning that the top layer and the bottom layer are fully decoupled in the 0-30 bilayer graphene domains. Additionally, no D peaks were observed in FIG. 20E, demonstrating the high-quality of as-produced 0-30 bilayer graphene domains. Two sets of SAED patterns (FIG. 20F) were observed in the bilayer region of 0-30 bilayer graphene domains, with the twist angle at 30°, matching well with the optical observation in FIG. 20D.

The stacking order can be further confirmed by FT-IR with synchrotron radiation. As shown in FIG. 20G, 0-0 bilayer graphene shows a dip at ~350 meV in the reflection spectrum. This can be ascribed to the Van Hove singularity of optical transition between two parallel bands in A-B stacked bilayer graphene. In contrast, 0-30 bilayer graphene's reflection spectrum has no dip feature in the mid infrared range (FIG. 20H), which reflects the decoupled nature of the two layers at low energy. 15 0-0 bilayer graphene domains and 15 0-30 bilayer graphene domains were investigated by FT-IR with synchrotron radiation in this research and the results were consistent with those shown in FIGS. 20G-H.

Figure 26:
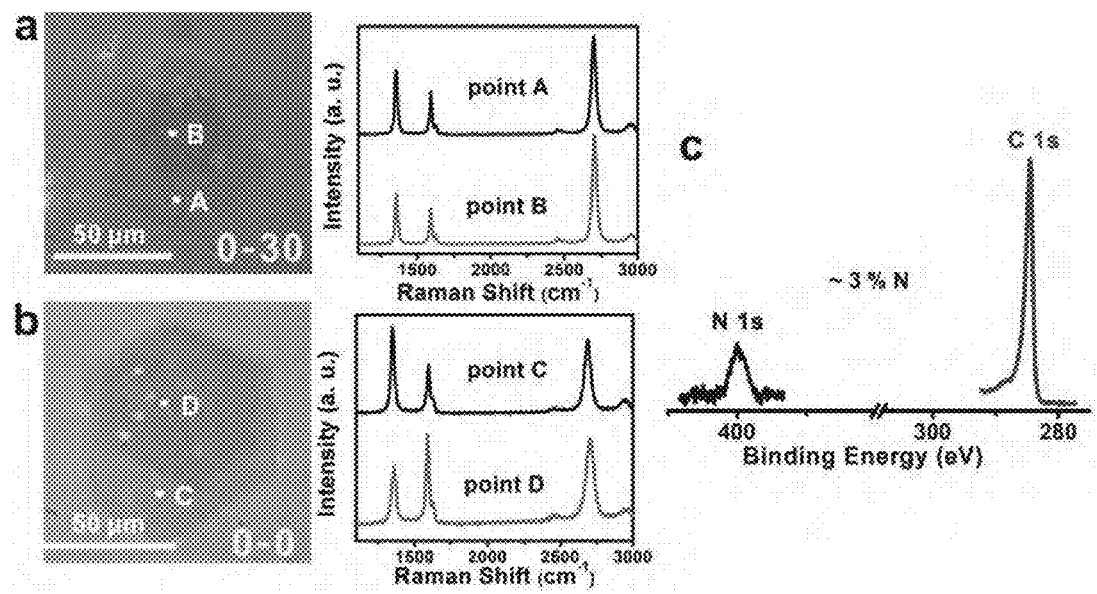
FIG. 26 shows data relating to the characterization of N-doped bilayer single-crystal graphenes.

When ammonia was introduced during the growth process, N-doped single-crystal bilayer graphene domains were synthesized with a nitrogen content of ~3% (FIG. 26), which provides more potential for further studies in electronics, optics and thermal conduction of such materials.

Figure 27:
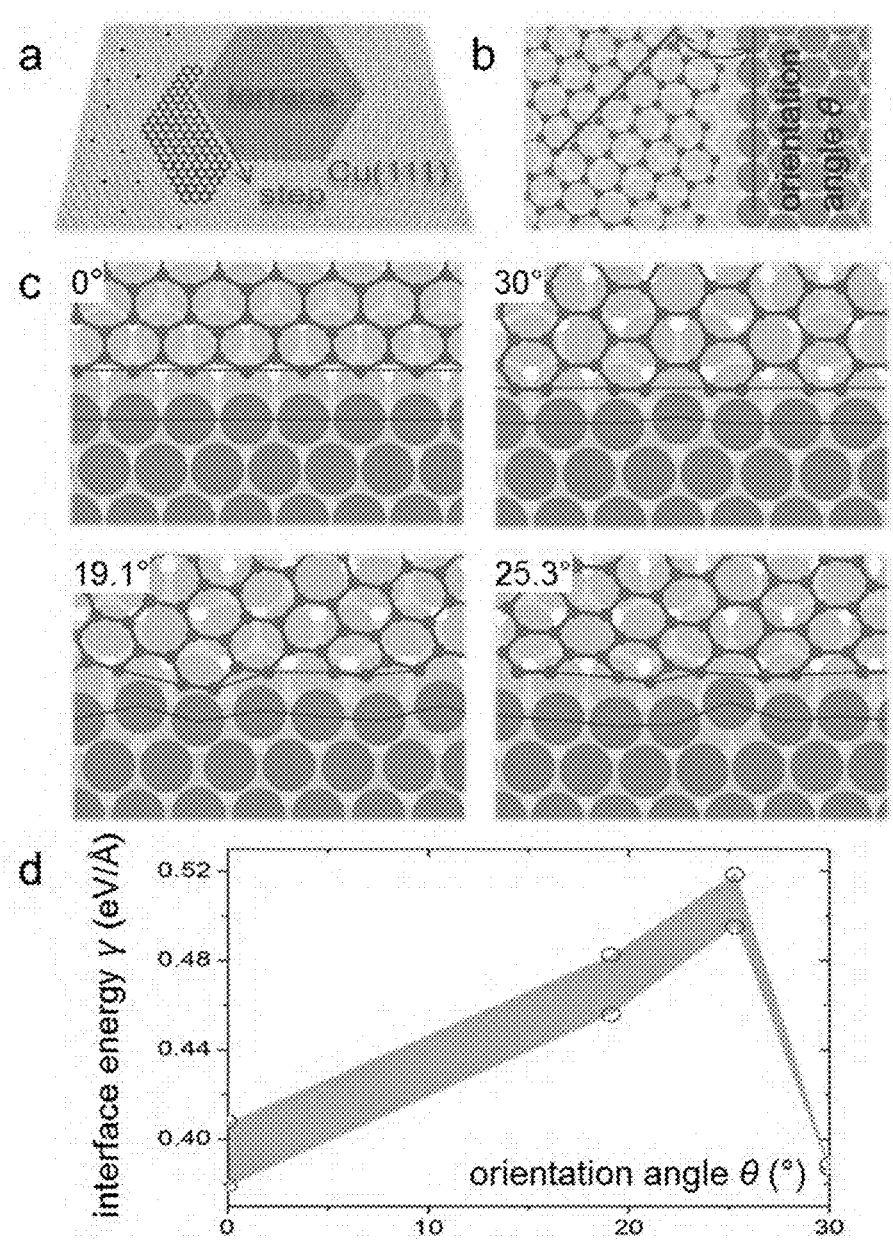
FIG. 27 shows schemes and analyses relating to graphene nucleation on Cu.

It is envisioned that the 0° Bernal stacking also dominates in graphite as well. This is due to the Van der Waals interlayer interaction, which has an energy minimum at 0°, the Bernal stacking configuration. In contrast, it is envisioned that the 30° orientation is incommensurate, with high stacking energy, and thus barely appears in graphite. However, as demonstrated in this research, the 30° graphene domain is one of the two preferred orientations. This surprising fact suggests that the interlayer interaction is no longer the guiding force of graphene orientation. In fact, as shown in FIG. 27, the interaction between the Cu step and graphene during the nucleation stage can determine its orientation.

Figure 28:
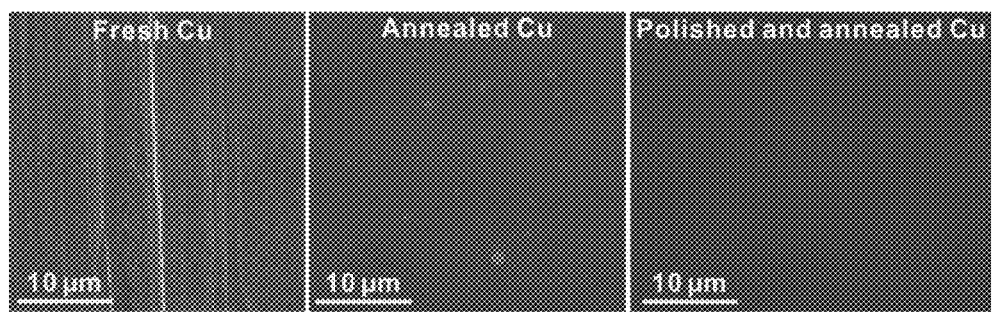
FIG. 28 shows various images of Cu surface.
Figure 29:
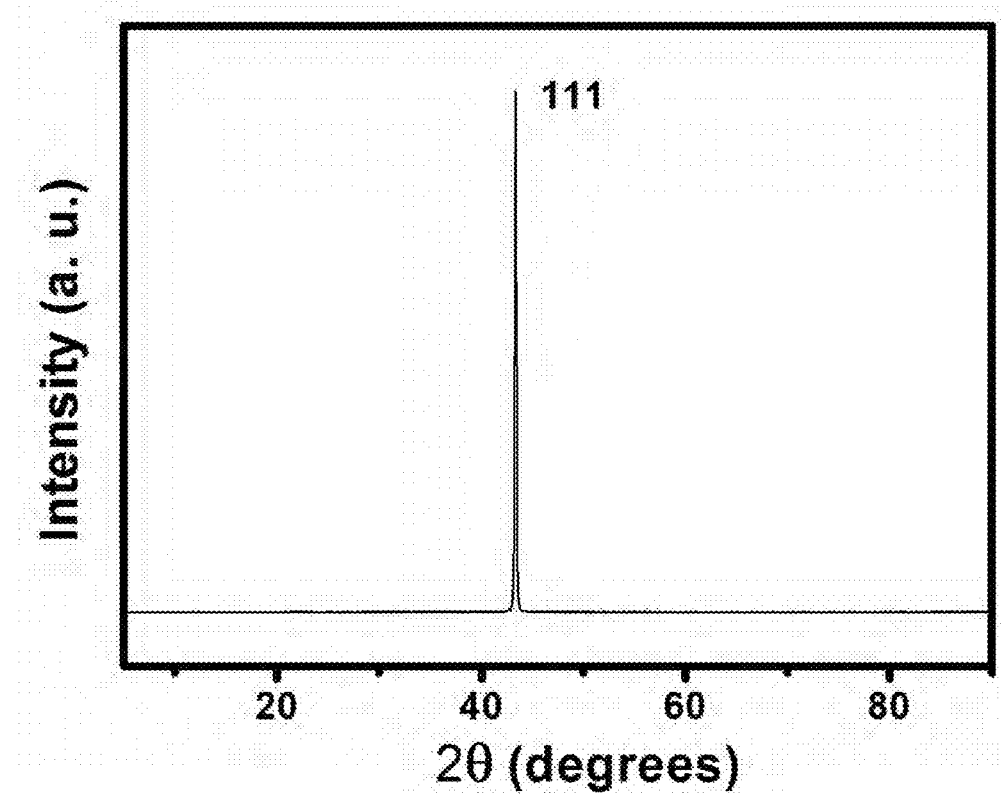
FIG. 29 is a typical XRD pattern of pretreated Cu, indicating the dominant Cu (111) face.

Without being bound by theory, it is envisioned that the CVD growth of graphene starts from a nucleation site and then extends via sequential addition of C atoms to the graphene edge. For electrochemically polished and annealed Cu, impurities and sharp wrinkles have been removed (FIG. 28), leaving the Cu steps (FIG. 27A) as major nucleation sites since they provide low-energy sites for C atoms. In addition, the fact that the few-layer graphene are almost concentric suggests that they share the same nucleation site. During the nucleation, a graphene-Cu interface is formed, and defines the orientation between graphene and Cu surface, as shown in FIG. 27B. After the nucleation, the edges of the graphene domain are bound by the Cu, which fixes the orientation during the growth. The energy-preferred graphene-Cu interface can lead to preferred orientation between graphene and Cu, and eventually result in preferred orientation between graphene layers. The pretreated Cu foil used here is mainly composed of (111) surfaces (FIG. 29), on which the Cu steps are microscopically straight with closest-packed atoms (FIG. 27B), as the most stable configuration. The graphene edge atoms tend to be close to the step atoms, in order to efficiently saturate their dangling bonds and minimize the energy. The 0° and 30° render straight ZZ and AC graphene edges, respectively, and thus could be expected to contact the Cu steps more efficiently.

The above mechanism was quantified by first-principle calculations. Density functional theory (DFT) calculations were performed with Perdew-Burke-Ernzerhof parametrization (PBE) of generalized gradient approximation (GGA) and projector-augmented wave (PAW) potentials, as implemented in the Vienna ab Initio Simulation Package (VASP). Graphene ribbons and Cu steps were placed in contact and then relaxed to model the graphene-Cu interface. The periodic cell was chosen to reduce the lattice mismatch below 4%. Further details of the computations can be found in the subsections herein. FIG. 27C shows the atomic structure of graphene-Cu interfaces, for four orientations: 0°, 19.1°, 25.3° and 30°. Clearly, for 0° and 30° interface, both the graphene edges and Cu steps remain almost straight, similar to their isolated structures. However, for 19.1° and 25.3°, the Cu steps are distorted, and the graphene edges are highly buckled in the surface normal direction (middle panel of FIG. 30), suggesting unstable interfaces. FIG. 27D shows the interface energy as a function of the orientation angle. The interface energy is defined in eq 1:

$$\gamma = \gamma_{graphene} + [E(g+Cu) - E(Cu) - E(g)]/L \quad (1)$$

In this equation, $\gamma_{graphene}$ is the edge energy of graphene, taken from reference 46. E (g+Cu) is the total energy of the system, E (Cu) is the energy of the Cu steps, and E (g) is the energy of graphene, and L is the length of the interface. So [E (g+Cu)–E (Cu)–E (g)]/L gives the binding energy (per length) of the interface. The vertical spread of data points for the same orientation reflects the computation uncertainty due to the difficulty of matching the graphene and Cu lattices in the periodic cell so as to minimize the mismatch strain in the system (see supporting information). The interface energies have two clear local minima at 0° and 30°, in agreement with their undistorted atomic structures. Therefore, the graphene-Cu interface has two preferred orientations: 0° and 30°.

Figure 30:
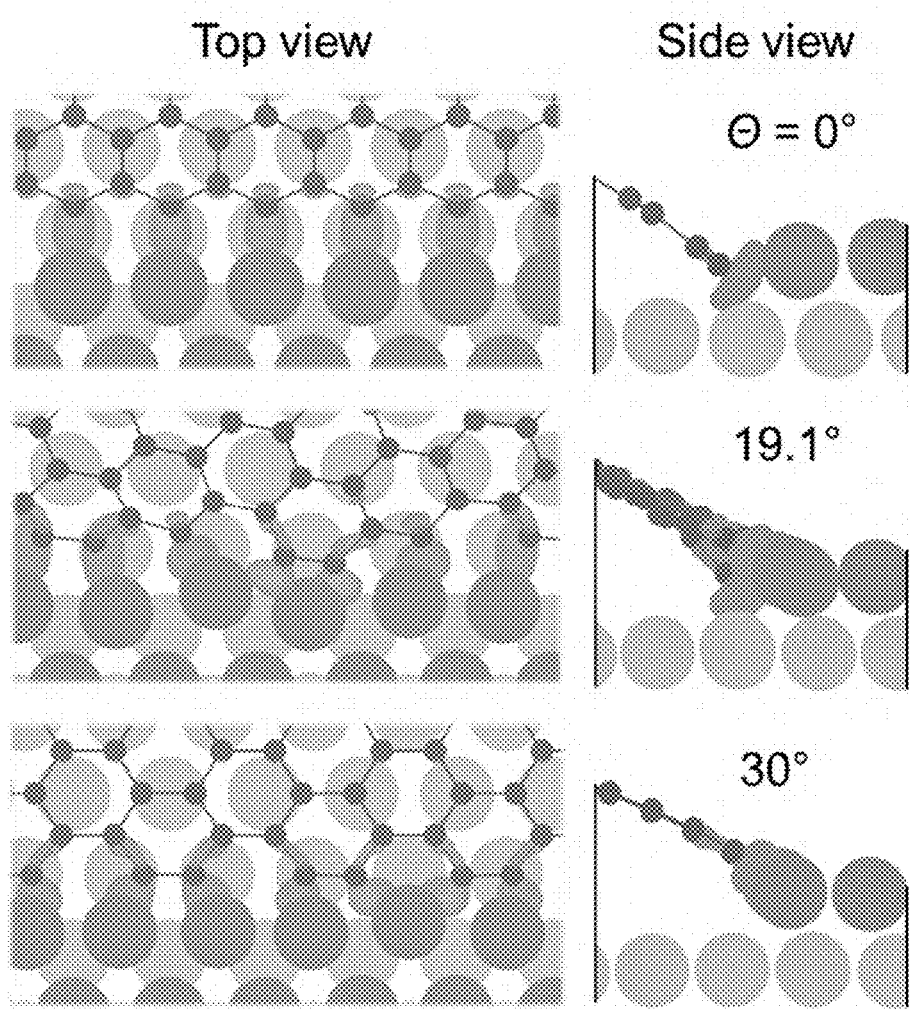
FIG. 30 is an electron-density-enhancement iso-surface (in blue, defined in eq 2 in Example 2) of the graphene-Cu step interface. The C atoms are represented by black spheres, and the Cu are shown in red. For clarity, only two Cu layers are displayed. The numbers are the orientation angles of graphene with respect to the Cu(111) surface.

Interestingly, though the edge energy of graphene decreases monotonically as a function of orientation angle, its interface energy with Cu step has a concave shape. This is because ZZ graphene edge is bound more strongly to Cu step, which reduces the interface energy more significantly. It can be better seen from the electron-density-difference $\Delta\rho$ (eq 2), as shown in FIG. 30:

$$\Delta\rho = \rho(g+Cu) - \rho(g) - \rho(Cu) \quad (2)$$

In this equation, ρ (g+Cu) is the electron density of the graphene-Cu interface. ρ (g) and ρ (Cu) are the electron densities for graphene and Cu, with same atomic coordinates as in the interface. Applicants observed electron density accumulation at the interface, suggesting the graphene-Cu interface has covalent bonding features. The electron depletions are mainly located on the Cu atoms, while not plotted in FIG. 30 for clarity. At the 0° interface, the ZZ edges are bound with both Cu step atoms and those under the step. In contrast, at the 30° interface, the AC edges are only bound with Cu step atoms. The extra coordination of the ZZ edge enhances its binding with Cu (0.76-0.79 eV/Å, compared to the AC edge binding energy 0.61 eV/Å), and thus reduces its interface energy. For other angles, the graphene edges are combinations of ZZ and AC segments. The ZZ segment tends to be docked between the Cu step and the layer underneath, similar to the pure ZZ edge, while the AC segment favors only the Cu steps. As a result, the edge becomes corrugated (FIG. 30), leading to high interface energy.

During the CVD growth, the graphene sheet could grow across the Cu step where it originally nucleated by addition of C atoms to the interface. Those C atoms come from the decomposed hydrocarbons on the surface (or terrace), and transport through surface or subsurface diffusion. Therefore, the Cu steps can be re-exposed and serve as the nucleation sites for a second graphene layer. A detailed description on the nucleation of multilayer graphene can be found in the subsections herein. The new layer again has preference for 0° and 30°. Eventually, few-layer graphene grows on clean Cu, with either 0° or 30° orientation with respect to each other.

In summary, Applicants report in this Example the CVD synthesis of ~100 μm hexagonal bi- and trilayer graphene single crystals on pretreated Cu foils. The as-made graphene domains have almost exclusively either Bernal stacking (0°) or anomalous 30° interlayer rotations. A growth mechanism was proposed and supported by the first-principle calculations, which explains the graphene interlayer rotation and agrees well with experimental observations. The as-made graphene domains were isolated from Cu surfaces and transferred onto silica wafers or trench-patterned silica, enabling the further studies of their thickness- and orientation-dependent electronics and optoelectronics.

EXAMPLE 2.1

Synthesis of Bi- and Trilayer Graphene Domains

Bi- and trilayer graphene domains with preferred 0° and 30° interlayer stacking orientations were fabricated in one batch by the CP-CVD system described previously (in Example 1 and *ACS Nano*, 2012, 6, 9110-9117) using research grade $CH_4$ (99.999% purity, Matheson) as the carbon feedstock and ultrahigh purity $H_2$ (99.999%, Matheson) as the reduction gas. A standard 1-inch quartz tube was used as the reaction chamber in a split CVD furnace. Temperatures were pre-calibrated using a k-type thermocouple probe (Omega Engineering, Inc.) before every growth. The chamber pressure was controlled by a vacuum valve (KF-25, Kurt J. Lesker) and a metering valve (SS-4BMG, Swagelok).

The typical synthesis was achieved via the following double-annealing procedures. A 25-μm-thick 2 cm×4 cm Cu foil (99.8% purity, Alfa Aesar) was first electrochemically polished and then annealed under high pressure for 7 h (the first-time annealing) as described previously (Example 1 and *ACS Nano*, 2012, 6, 9110-9117). The pretreated Cu foil was cooled down to room temperature and then cut into ~2 cm×2 cm pieces. After this, the Cu was loaded into the CP-CVD system and the reaction chamber was evacuated to ~1 mT by completely opening the vacuum valve. The temperature was increased to 1077° C. and then 65 sccm of $H_2$ was introduced into the reaction chamber for 10 min. After this, the vacuum valve was turned off and the chamber pressure was adjusted to 110 Torr by the metering valve; the Cu foil was moved into the hot region of the furnace by a magnetic rod and annealed for 10 min (the second-time annealing). After the second-time annealing, 0.1 sccm of $CH_4$ was introduced into the reaction chamber for 115 min for the graphene growth. After the growth, the $CH_4$ flow was turned off and the Cu foil was quickly removed from the hot region using a magnetic rod and permitted to cool to room temperature.

As described previously (in Example 1 and *ACS Nano*, 2012, 6, 9110-9117), one-time annealing process was used for general single-crystal graphene synthesis. For the synthesis of ~100 μm-sized bi- and trilayer graphene domains as described in this Example, Applicants used a double annealing process. The sharp wrinkles and contaminations were removed from Cu foils during the first-time annealing process (1500 Torr/1077° C./7 h). Next, Cu foils were cooled to room temperature and Cu step edges were formed during this cooling process. The second-time annealing was conducted under mild conditions for a short time (110 Torr/1077° C./10 min), which was used to preheat Cu foils before graphene growth and could not remove Cu step edges. After the second-time annealing, $CH_4$ was introduced for graphene growth for ~115 min. In this case, Cu step edges worked as active sites for the growth of bi- and trilayer graphene domains with preferred 0° and 30° interlayer stacking orientations, which was explored by first-principles calculations. As a control experiment, in the second-time annealing, if Applicants still used the annealing conditions used in the first-time annealing (1500 Torr/1077° C./7 h), which could remove most step edges and partially melt Cu, Applicants still obtained millimeter-sized monolayer graphene domains. This observation matched well with several recent reports concerning the growth of large single-crystal monolayer graphene on liquid Cu.

EXAMPLE 2.2

Devices Fabrication and Measurement

Single-crystal graphene domains were transferred onto $SiO_2$ (100 nm)/Si wafers using the methods described previously (in Example 1 and *ACS Nano*, 2012, 6, 9110-9117). After transferring onto $SiO_2$ (100 nm)/Si wafers, electrode leads were defined with electron beam lithography (EBL) followed by the electron beam evaporation of Ti/Au (1 nm/60 nm) and lift-off. A six-probe station (model FWPX, Desert Cryogenics-Lake Shore) was used to measure the electrical properties under a pressure of $10^{-5}$ to $10^{-6}$ Torr using an Agilent 4155C semiconductor parameter analyzer.

EXAMPLE 2.3

Trenches Patterning on Silica Substrates

A conventional photolithography method was used to pattern the trenches on p-type Si (100) with substrate covered with thermally grown 300 mm thick $SiO_2$ after wafer-cleaning process by using acetone, IPA, and DI water. Then, a positive photoresistor (S1813) was spin-coated at 4000 rpm for 40 s on $SiO_2$ (300 nm)/Si wafer, and the soft baking on a hot plate was performed at 110° C. for 3 min. Trenches in the photoresist layer were formed with two different sizes of a rectangular-shaped photomask: 3×20 μm$^2$ and 5×20 μm$^2$. In order to remove $SiO_2$ in the trenches not covered by the photoresist, an RIE (reactive ion etching) process ($CHF_3/O_2$, 25/15 sccm) was performed for ~8 min with RF 150 W and pressure 100 mTorr. Acetone was used to remove the remaining photoresist. The depth of the trench was ~250 nm.

EXAMPLE 2.4

Computation Details for Graphene-Cu Interface

Figure 31:
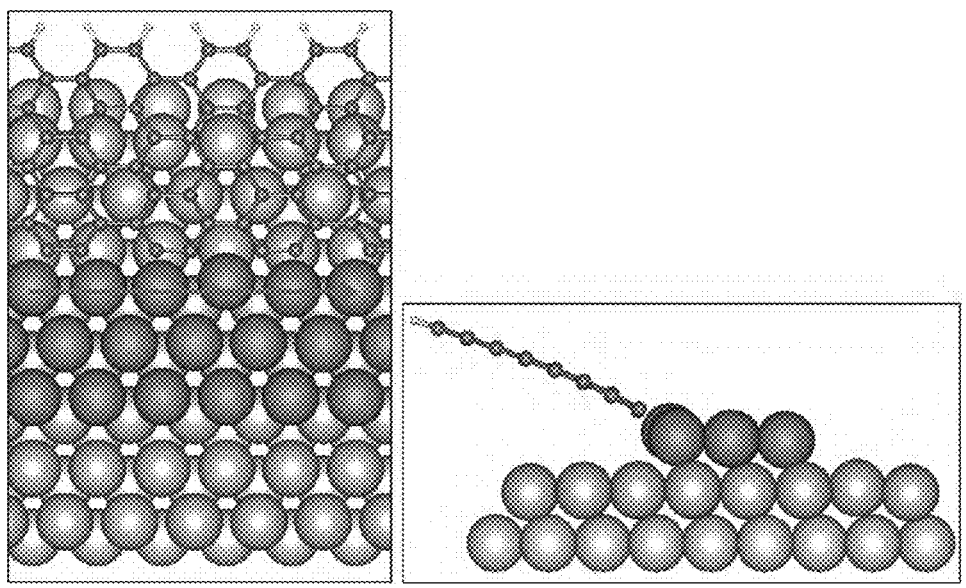
FIG. 31 shows a super cell for modeling the graphene-Cu interface. A 30° orientation is shown here as an example. The left panel is the top view and the right one is the side view. The blue arrow shows the cell length along ribbon direction. The C atoms are represented by black spheres, and the Cu atoms are shown in red, where the topmost Cu layer is highlighted in bold color.

The graphene-Cu interface was simulated using a ribbon model, as shown in FIG. 31. The graphene free edge was terminated with H. The Cu was composed of three layers, where the bottom layer was fixed in the surface normal direction. An energy cutoff of 400 eV was used for the plane wave basis set. More than 10 Å spacing was kept in vacuum to avoid interactions between non-realistic periodic replicas. The structures are fully relaxed until the force is less than 0.01 eV/Å for each atom.

According to calculations, the graphene has a lattice parameter of 2.47 Å, while the Cu(111) surface has a lattice parameter of 2.57 Å. In order to reduce the lattice mismatch, Applicants used the following two sets: (1) The periodic cell length along the ribbon direction was chosen based on the graphene lattice parameter, 2.47 Å for 0°, 13.07 Å for 19.1°, 15.02 Å for 25.3°, and 12.83 Å for 30°, which corresponded to lattice mismatch with Cu by −4%, 2%, −3%, and <−1%, respectively; (2) The periodic cell length along the ribbon direction was chosen based on the Cu lattice parameter, 2.57 Å for 0°, 12.85 Å for 19.1°, 15.42 Å for 25.3°, 12.85 Å for 30°, which corresponded to lattice mismatch with graphene by 4%, −2%, 3%, and <1%. The interface energies computed from the two sets are shown in FIG. 27D, and the structures relaxed from the first set are shown in FIG. 27C.

EXAMPLE 2.5

Few-layer Graphene Domain Nucleation

Figure 32:
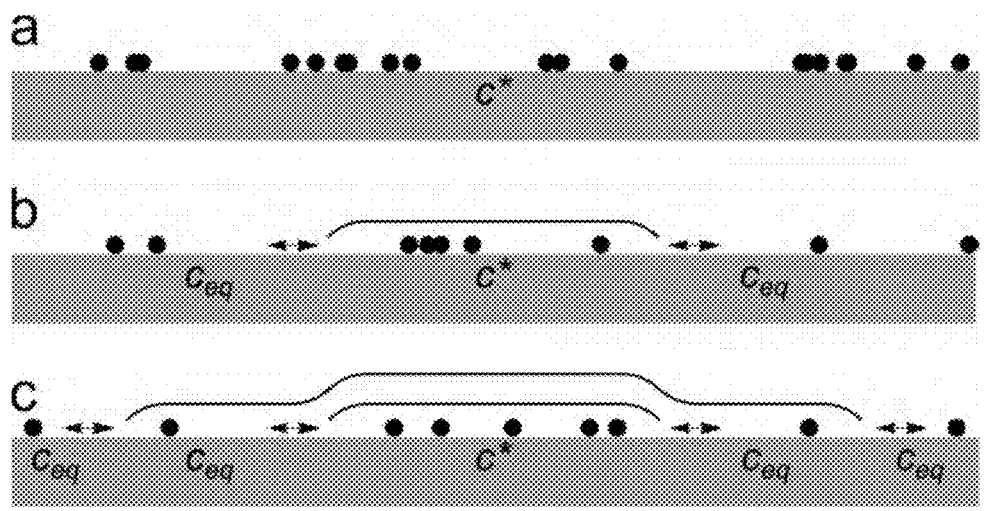
FIG. 32 shows a mechanism of few-layer graphene domain nucleation.

Formation of graphene nuclei requires a concentration of carbon atoms on Cu that exceeds the stationary concentration during growth (FIG. 32A). Therefore, formation of new graphene domains on a clean Cu surface quickly becomes challenging. However, DFT calculations show that C atoms can be stabilized under existing graphene islands by about 0.3 eV/atom, which translates into a concentration increase by a factor of about 15, so that the critical concentration can become reachable again (FIG. 32B). In addition, the graphene overlayer prevents C atom desorption, increasing the capture zone of the new nucleus. Once a second nucleation event takes place, the concentration of C atoms under the top layer will again drop to the stationary value preventing new nucleation events until the smaller bottom island reaches a large enough size for a third nucleation event beneath it, and so on (FIG. 32C). While the Cu covered by graphene is protected from the atmosphere, the necessary C atoms can be supplied through subsurface diffusion. If this event happens at relatively early stages while the newest island is still small, the concentricity of islands becomes a natural consequence of this scenario. This mechanism of graphene few-layer nucleation bears a certain resemblance to the growth of multiwalled carbon nanotubes.

The calculations were performed with the SIESTA code using the local density functional theory and double-zeta-polarized basis sets. The model systems were 4×4 supercells of Cu(111) surface with 3 atomic layers of metal. Graphene was assumed to be commensurate with Cu. In real systems, the lattice parameter mismatch would result in Moire structures with different Cu-graphene stacking. This was taken into account by checking two different stackings (fcc-top and hcp-top), for both of which stabilization of C atoms by about 0.3 eV compared to pristine Cu surface was observed.

What is claimed is:

1. A method of forming large-size single-crystal graphene, wherein the method comprises:
   cleaning a surface of a catalyst;
   annealing the surface of the cleaned catalyst, wherein the annealing occurs at pressures of 1,000 Torr or higher;
   applying a carbon source to the surface of the catalyst; and
   growing single-crystal graphene on the surface of the catalyst,
   wherein the formed single-crystal graphene has a width that ranges from 1 mm to 5 meters.

2. The method of claim 1, wherein the catalyst is selected from the group consisting of Ni, Co, Fe, Pt, Au, Al, Cr, Cu, Mg, Mn, Mo, Rh, Si, Ta, Ti, W, U, V and Zr, mixtures thereof, and combinations thereof.

3. The method of claim 1, wherein the catalyst is a copper foil.

4. The method of claim 1, wherein the catalyst is in polycrystalline form.

5. The method of claim 1, wherein the cleaning comprises electrochemical-polishing the surface of the catalyst.

6. The method of claim 1, wherein the annealing comprises thermal annealing.

7. The method of claim 6, wherein the thermal annealing occurs at temperatures of 500° C. or higher.

8. The method of claim 6, wherein the thermal annealing occurs at pressures of 1,500 Torr or higher.

9. The method of claim 6, wherein the thermal annealing occurs in a reductive environment comprising a stream of a reductive gas.

10. The method of claim 9, wherein the reductive gas is hydrogen.

11. The method of claim 1, wherein the applying of the carbon source occurs by chemical vapor deposition.

12. The method of claim 1, wherein the carbon source is selected from the group consisting of hydrocarbons, polymers, non-polymeric carbon sources, small molecules, organic compounds, fullerenes, fluorenes, carbon nanotubes, phenylene, ethylenes, sucrose, sugars, polysaccharides, carbohydrates, proteins, and combinations thereof.

13. The method of claim 1, wherein the carbon source is a hydrocarbon.

14. The method of claim 13, wherein the hydrocarbon is methane.

15. The method of claim 1, wherein the growing occurs at temperatures of 500° C. or higher.

16. The method of claim 1, wherein the growing occurs at a pressure of between 100 Torr and 110 Torr.

17. The method of claim 1, wherein the growing occurs for 2 hours or longer.

18. The method of claim 1, wherein the growing occurs in a reductive environment comprising a stream of a reductive gas.

19. The method of claim 18, wherein the reductive gas is hydrogen.

20. The method of claim 1, further comprising a step of controlling the morphology of the single-crystal graphene by adjusting various growth parameters.

21. The method of claim 20, wherein the growth parameters comprise flow rate of a reductive gas during growth, growth time, growth temperature, annealing temperature, growth pressure, type of catalyst, and combinations thereof.

22. The method of claim 1, further comprising a step of separating the formed single-crystal graphene from the surface of the catalyst.

23. The method of claim 1, further comprising a step of transferring the formed single-crystal graphene to a substrate.

24. The method of claim 1, wherein the method occurs without the use of a vacuum.

25. The method of claim 1, wherein the method occurs under positive pressure.

26. A method of forming large-size and stacked layers of single crystals of graphene, wherein the method comprises:
   cleaning a surface of a catalyst;
   annealing the surface of the cleaned catalyst, wherein the annealing occurs at pressures of 1,000 Torr or higher;
   applying a carbon source to the surface of the catalyst; and
   growing stacked layers of single crystals of graphene on the surface of the catalyst,
   wherein the single crystals of graphene comprise widths that range from 1 mm to 5 meters.

27. The method of claim 26, wherein the stacked layers of single crystals of graphene comprise a bilayer.

28. The method of claim 26, wherein the stacked layers of single crystals of graphene comprise a trilayer.

29. The method of claim 26, wherein the stacked layers of single crystals of graphene form by repeating the applying and growing steps until a desired number of stacked layers of single crystals of graphene are formed.

30. The method of claim 26, wherein the catalyst is selected from the group consisting of Ni, Co, Fe, Pt, Au, Al, Cr, Cu, Mg, Mn, Mo, Rh, Si, Ta, Ti, W, U, V and Zr, mixtures thereof, and combinations thereof.

31. The method of claim 26, wherein the catalyst is a copper foil.

32. The method of claim 26, wherein the cleaning comprises electrochemical-polishing the surface of the catalyst.

33. The method of claim 26, wherein the annealing comprises thermal annealing.

34. The method of claim 33, wherein the thermal annealing occurs at temperatures of 500° C. or higher and pressures of 1,500 Torr or higher.

35. The method of claim 33, wherein the thermal annealing occurs in a reductive environment comprising a stream of a reductive gas.

36. The method of claim 26, wherein the applying of the carbon source occurs by chemical vapor deposition.

37. The method of claim 26, wherein the carbon source is a hydrocarbon.

38. The method of claim 26, wherein the growing occurs at temperatures of 500° C. or higher and pressures of 100 Torr or higher.

39. The method of claim 26, wherein the growing occurs in a reductive environment comprising a stream of a reductive gas.

40. The method of claim 26, further comprising a step of controlling the morphologies of the single crystals of graphene by adjusting various growth parameters.

41. The method of claim 40, wherein the growth parameters comprise flow rate of a reductive gas during growth, growth time, growth temperature, annealing temperature, growth pressure, type of catalyst, and combinations thereof.

42. The method of claim 26, further comprising a step of separating the formed single crystals of graphene from the surface of the catalyst.

43. The method of claim 26, further comprising a step of transferring the formed single crystals of graphene to a substrate.

44. The method of claim 1, wherein the growing occurs at pressures below 760 Torr.

45. The method of claim 26, wherein the growing occurs at pressures below 760 Torr.

* * * * *